United States Patent [19]
Baxter et al.

[11] Patent Number: 5,991,908
[45] Date of Patent: *Nov. 23, 1999

[54] BOUNDARY SCAN CHAIN WITH DEDICATED PROGRAMMABLE ROUTING

[75] Inventors: Glenn A. Baxter, Ben Lomond; Kiran B. Buch, Fremont; Raymond C. Pang, San Jose; Edwin S. Law, Saratoga, all of Calif.

[73] Assignee: Xilinx, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/939,757

[22] Filed: Sep. 29, 1997

[51] Int. Cl.⁶ .................................................... G01R 31/28
[52] U.S. Cl. ........................................ 714/727; 395/500.17
[58] Field of Search .............................. 371/22.32, 22.31, 371/22.2, 22.34, 22.5; 395/182.01, 183.06, 183.19, 500.17, 500.18; 364/490, 550; 714/727, 725, 726, 729, 733, 3, 5, 30; 365/201

[56] References Cited

U.S. PATENT DOCUMENTS

| | | | |
|---|---|---|---|
| 4,912,709 | 3/1990 | Teska et al. | 371/22.1 |
| 5,267,146 | 11/1993 | Shimizu et al. | 364/512 |
| 5,300,835 | 4/1994 | Assar et al. | 307/475 |
| 5,394,034 | 2/1995 | Becker et al. | 326/39 |
| 5,517,646 | 5/1996 | Piccirillo et al. | 395/651 |
| 5,537,536 | 7/1996 | Groves | 395/183.04 |
| 5,550,839 | 8/1996 | Buch et al. | 371/22.1 |
| 5,550,843 | 8/1996 | Yee | 371/22.3 |
| 5,572,710 | 11/1996 | Asano et al. | 395/500 |
| 5,651,013 | 7/1997 | Iadanza | 371/22.3 |
| 5,706,296 | 1/1998 | Whetsel | 371/22.3 |
| 5,732,246 | 3/1998 | Gould et al. | 395/500 |
| 5,790,561 | 8/1998 | Borden et al. | 371/22.1 |
| 5,812,562 | 9/1998 | Baeg | 371/22.31 |

FOREIGN PATENT DOCUMENTS

| | | |
|---|---|---|
| 0575124A2 | 12/1993 | European Pat. Off. . |
| 61-053827 | 3/1986 | Japan . |
| 02146815 | 6/1990 | Japan . |
| 03117020 | 5/1991 | Japan . |
| 04158627 | 6/1992 | Japan . |

OTHER PUBLICATIONS

"The Hardwire Data Book", (1994), available from Xilinx, Inc., 2100 Logic Drive, San Jose, California 95124.

"The Programmable Logic Data Book", (1996), pp., 4–47, 4–48, 4–54, 4–80, 4–309, available from Xilinx, Inc., 2100 Logic Drive, San Jose, California 95124.

"The Programmable Logic Data Book", (1993), pp. 2–82, available from Xilinx, Inc., 2100 Logic Drive, San Jose, California 95124.

(List continued on next page.)

*Primary Examiner*—Robert W. Beausoliel, Jr.
*Assistant Examiner*—Nadeem Iqbal
*Attorney, Agent, or Firm*—Lois D. Cartier

[57] ABSTRACT

A programmable IC is provided that includes dedicated boundary scan logic having a programmable boundary scan bit-order. Boundary scan cells are provided, each cell being capable of providing the boundary scan functions associated with one I/O pad. In a mask programmable device, dedicated tracks are provided for adding mask programmable interconnect lines. In other programmable ICs such as FPGAs or PLDs, programmable interconnect lines are provided. In either case, the interconnect lines are used to implement the boundary scan data chain. Using these lines, the programmed device can "swap the order" of I/O cells in the boundary scan data chain, or leave cells out of the chain entirely. In one embodiment, the interconnect lines traverse each cell, programmably connecting the data inputs and outputs of adjacent or non-adjacent boundary scan cells. In other embodiments, the interconnect lines are physically located outside the boundary scan cells, either in a ring between the cell and the core or in the core itself.

28 Claims, 9 Drawing Sheets

OTHER PUBLICATIONS

"IEEE Standard Test Access Port and Boundary–Scan Architecture", IEEE Std 1149–1990, Chapters 3 and 10, copyright, 1993 available from The Institute of Electrical and Electronic Engineers, Inc., 345 East 47th Street, New York, NY 10017.

Xilinx Application Note XAPP017 version 1.1 entitled, "Boundary Scan in XC4000 and XC5000 Series Devices", published July 15, 1996, available from Xilinx Inc., 2100 Logic Drive, San Jose, California 95124.

Wilson, Ron, "Xilinx Speeds Submicron–Process Ramp", EE Times, Feb. 3, 1997.

"The Programmable Logic Data Book", available from Xilinx, Inc., 2100 Logic Drive, San Jose, CA 95124, 1994, pp. 2–7 through 2–46.

"The XC5200 Logic Cell Array Family Technical Data Booklet" Oct. 1995 (referenced as XC5200™ FPGA Data Sheet) available from Xilinx, Inc., 2100 Logic Drive, San Jose, CA 95124.

"The Programmable Logic Data Book", available from Xilinx, Inc., 2100 Logic Drive, San Jose, CA 95124, 1994, pp. 2–7 through 2–46.

"The XC5200 Logic Cell Array Family Technical Data Booklet" Oct. 1995 (referenced as XC5200™ FPGA Data Sheet) available from Xilinx, Inc., 2100 Logic Drive, San Jose, CA 95124.

BOUNDARY SCAN CHAIN WITH DEDICATED PROGRAMMABLE ROUTING

CROSS-REFERENCE TO RELATED APPLICATIONS

This application relates to the following commonly assigned, concurrently filed U.S. patent applications:

Ser. No. 08/937,809, invented by Edwin S. Law, Kiran B. Buch, Glenn A. Baxter, and Raymond C. Pang entitled "Hardwire Logic Device Emulating an FPGA"; and Ser. No. 08/940,154, invented by Glenn A. Baxter, Kiran B. Buch, and Edwin S. Law entitled "Programmable I/O Cell with Dual Boundary Scan", and to the following commonly assigned, co-pending U.S. patent application:

Ser. No. 08/594,933 invented by Glenn A. Baxter entitled "Configuration Emulation of a Programmable Logic Device", filed Jan. 31, 1996, which are incorporated herein by reference.

BACKGROUND OF THE INVENTION

1. Field of the Invention

The invention relates to mask programmable integrated circuits (ICs). More particularly, the invention relates to mask programmable ICs manufactured to emulate Field Programmable Gate Arrays (FPGAs).

2. Description of the Background Art

An FPGA is a user-programmable device that can be programmed in the field and then re-programmed with the same or a different bitstream, to perform the same or a different function. An FPGA therefore must be capable of producing a large variety of logical behaviors. This flexibility has its price in terms of silicon area, i.e., an FPGA performing any of several functions typically has a higher monetary cost than a device that is capable of performing only a single function. Therefore, when a system including an FPGA reaches the point where it is considered unlikely to change, a manufacturer sometimes removes the FPGA from the system, and replaces the FPGA with a pin-, timing- and function-compatible replacement that can only perform the single function necessary in the system. Buch et al describe such a device in U.S. Pat. No. 5,550,839, "Mask-Programmed Integrated Circuits Having Timing and Logic Compatibility to User-Configured Logic Arrays" [docket M-2355 US], which is incorporated herein by reference and title to which is held by the assignee hereof. One such pin-, timing- and function-compatible replacement for an FPGA is the HardWire™ device from Xilinx, Inc., described in the "Hardwire Data Book" (hereinafter referred to as "the Hardwire Data Book"), published 1994, available from Xilinx, Inc., 2100 Logic Drive, San Jose, Calif. 95124, which is incorporated herein by reference. (Xilinx, Inc., owner of the copyright, has no objection to copying these and other pages referenced herein but otherwise reserves all copyright rights whatsoever.) The term "HardWire device" is used herein to describe a mask programmable IC capable of performing the same logical functions as a programmable IC that is not mask programmable, such as an FPGA or a PLD. The term "mask programmable IC" is used herein to describe an IC having many processing layers, the first several layers being common to all versions of the IC, and some or all of the remaining layers (typically including some or all of metal layers, via layers, and contact layers) being specific to a given IC manufactured for a specific purpose. Thus, the upper layers of the device are used to "program" the device to this specific purpose. A "programmed Hard-Wire device" is a HardWire device that has been processed to add the programmable mask layers.

Ideally, a HardWire device can emulate the FPGA it replaces in all system functionality, such that the replacement is transparent to the system. Therefore, the HardWire device should not only perform the same functions that were previously performed by the configured FPGA, but should also emulate the FPGA during the configuration process. An exception to this rule is when the FPGA configuration process did not involve other parts of the system (e.g., configuration was under the control of the FPGA), in which case configuration can sometimes be skipped without affecting system functionality. Another exception is when the system is altered at the time of the FPGA/HardWire replacement so that configuration is no longer performed.

A method used by Xilinx, Inc. to produce one type of HardWire device comprises virtually duplicating the architecture of the FPGA to be replaced, but replacing the software programmable configuration memory cells with mask programmable connections. The removal of the configuration memory cells significantly reduces the required silicon area, and therefore reduces the cost of the devices. Making the devices mask programmable allows much of the design and processing to be done only once for each FPGA product, e.g., once for the XC4003 device, once for the XC4005 device, once for the XC5202 device, etc. Top-level processing layers specific to the user's design are then added to customize the behavior of the HardWire device to match the functional behavior of the emulated FPGA as configured in the user's system. (The term "emulated FPGA" is used herein to mean the FPGA being replaced by the HardWire device.) When this method is used, the configuration behavior of the FPGA is emulated, as well as the behavior after configuration.

Since the FPGA architecture is virtually duplicated in this type of HardWire device, both the FPGA configurable logic block (CLB) making up the core logic array and the FPGA input/output block (IOB) must be redesigned for the HardWire device. (The term "IOB" as used herein refers to the FPGA I/O block and does not apply to the I/O cell of the HardWire device. The I/O cell of the HardWire device may be an input cell, an output cell, or a bidirectional input/output cell.) Although this approach leads to a HardWire device that closely resembles the emulated FPGA in timing and input/output (I/O) characteristics, the redesign procedure must be individually performed for each FPGA product family, since the architecture differs in each family. (The term "I/O characteristics" is used herein to mean AC and DC characteristics associated with the I/O. AC characteristics include rise and fall times and delays on both inputs and outputs. An example of DC characteristics is provided for the Xilinx XC4000E family of FPGAs on page 4–80 of the Xilinx 1996 Data Book entitled "The Programmable Logic Data Book" (hereinafter referred to as "the Xilinx 1996 Data Book"), published September 1996, available from Xilinx, Inc., 2100 Logic Drive, San Jose, Calif. 95124, which page is incorporated herein by reference.)

As a result of the extensive redesign required for both Configurable Logic Blocks (CLBs) and I/O Blocks (IOBs) of multiple FPGA product families, the redesign process (i.e., the design of HardWire replacements) incurs a high development cost. Additionally, a different HardWire product is required for each FPGA family as well as for devices of varying sizes, leading to a large number of products. These products must be separately manufactured, stored, sold, and supported by conversion software. (The term "conversion software" is used herein to mean software that converts a user's description of an FPGA design, such as a netlist, to a description that can be used to prepare masks for a mask programmed HardWire device.)

A second approach to manufacturing mask programmed replacement devices eliminates this undesirable overhead, but introduces other drawbacks. According to this method, a commercially available gate array is used to replace the FPGA, rather than designing a new mask programmable device. (The word "gate array" is used herein to mean a mask programmable IC comprising a core array of programmably interconnected transistors or gates and a set of input/output (I/O) cells. A gate array differs from an FPGA not only in being mask programmable, but also in the granularity of the core array, the basic repetitive element of the gate array core being a transistor, a gate, or a set of programmably interconnected transistors or gates rather than comprising larger blocks which may include lookup tables or flip-flops as in FPGAs. Some gate arrays also have RAM blocks or other specialized blocks in the core in addition to the basic repetitive element.)

This approach has the advantages of being low in cost, due to the elimination of the redesign process, and providing ready conversion, since the company that originally designs the gate array also typically provides software to implement a user's design in the gate array. However, a disadvantage of this method is that the I/O characteristics of the gate array are usually different from those of the FPGA, often sufficiently different to cause problems when the FPGA is removed from the system and the gate array is substituted. Special features of the FPGA I/O (such as a low slew-rate option, optional delay on the input, etc.) are typically lost in the conversion as well. An additional problem is that the gate array is incapable of emulating the configuration behavior of the FPGA unless the configuration logic is duplicated in the logic gates of the core, which results in fewer core logic gates available for the converted design. A circuit and method for maintaining the configuration process in such a HardWire device are described by Glenn A. Baxter in commonly assigned, co-pending U.S. patent application Ser. No. 08/594,933 [docket X-251 US] entitled "Configuration Emulation of a Programmable Logic Device", filed Jan. 31, 1996, which is referenced above and incorporated herein by reference. Similarly, boundary scan is also unavailable in gate arrays unless implemented in core logic gates. Implementing boundary scan in core logic gates uses about 72 gates per boundary scan cell, a very high cost in silicon area.

Therefore, it is desirable to have a programmable IC capable of emulating an FPGA, while closely matching the I/O characteristics, special features, configuration behavior, and boundary scan capability of the emulated FPGA. It is further desirable to have a single programmable IC capable of emulating any of a multiplicity of FPGAs.

SUMMARY OF THE INVENTION

According to a first aspect of the invention, a hybrid HardWire device is provided that comprises a gate array core and a set of mask programmable I/O cells having I/O characteristics similar to those of the FPGA, i.e., sufficiently the same so the HardWire device can be used as a drop-in replacement for the FPGA with no redesign of the original system. A user's design originally implemented in an FPGA can be emulated in the HardWire device, which then replaces the FPGA in the same board at a lower cost.

In another embodiment, the I/O cells are programmable such that they can emulate the I/O characteristics of FPGAs from any of two or more FPGA families. The I/O cells may be mask programmable or programmable by other means such as configurable memory cells or fuses. This ability reduces the number of separate devices that must be designed, manufactured, tested, stored, and sold, and also simplifies the software required to convert designs to the new device.

According to a second aspect of the invention, a mask programmable IC is provided that includes dedicated boundary scan logic in the I/O cells. Valuable core logic resources therefore need not be consumed to implement boundary scan logic. In one embodiment, one boundary scan cell is provided per I/O cell. In another embodiment, two boundary scan cells (blocks of logic) are provided for each I/O pad, each cell alone being capable of providing the boundary scan functions associated with one FPGA I/O pad. This embodiment provides great flexibility in emulating any of several FPGAs in any of several packages. By selectively choosing which of the boundary scan cells are included in the boundary scan data chain, the order of the boundary scan chain of the emulated FPGA in any of two or more packages can be reproduced. Boundary scan behavior is therefore emulated as well as the programmed logic behavior of the FPGA. In another embodiment, more than two boundary scan cells are provided per I/O cell.

In one embodiment, additional programmable interconnect lines accessing each boundary scan cell are provided. These interconnect lines can be used to programmably connect the data output of a first cell to the data input of second cell which need not be adjacent to the first. In another embodiment, programmable interconnect lines are provided from the data inputs and outputs of the boundary scan cells to the core logic to provide the possibility of connection through the core or to other logic in the core.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

Several mask programmable ICs according to the invention are described. The programmable ICs of the described embodiments are HardWire devices and are therefore mask programmable. However, the embodiments could also be implemented using other programming methods. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

In the figures herein, lines crossing each other are not connected unless there is a circle at the intersection. A dark circle denotes a "hard" connection, i.e., a connection which is not programmable. A clear circle denotes a programmable connection between two or more points on the same or different layers.

FIRST ASPECT OF THE INVENTION

Hybrid HardWire Device

Figure 1:
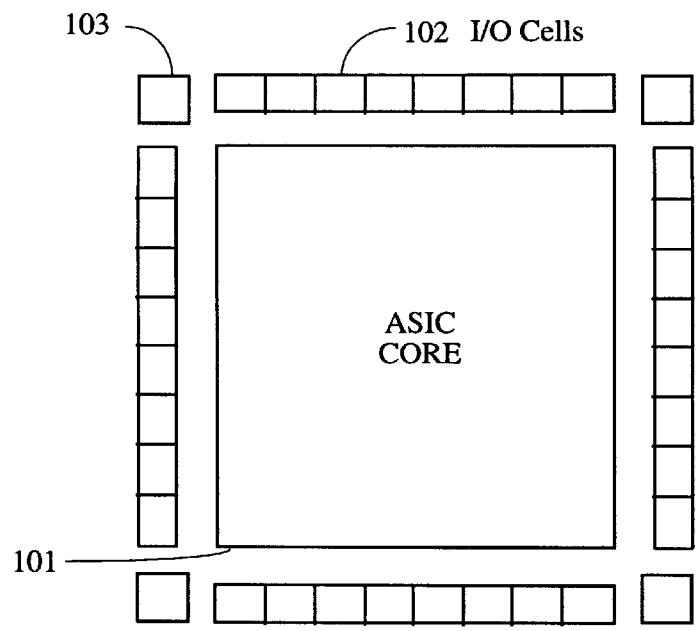
FIG. 1 shows a HardWire device in accordance with the first aspect of the invention.

FIG. 1 shows a hybrid HardWire device in accordance with a first aspect of the invention. In this embodiment, gate array core 101 is surrounded by a ring of I/O cells 102 that programmably interface with the gate array core and with signals outside the IC. Each of I/O cells 102 emulates one or more FPGA I/O pads. In some embodiments, some of the FPGA IOB logic is not included in the HardWire I/O cell. Instead, logic such as input and output registers originally implemented in the IOB of the emulated FPGA is mapped into the gate array core logic, thereby advantageously reducing the size of the I/O cell, and consequently reducing the size of the IC die. Preferably, the number of I/O pads (and therefore the number of I/O cells) provided is the largest number that will fit on the IC die. Although 32 I/O cells are shown in FIG. 1, most mask programmable ICs have many more I/O cells.

In the embodiment of FIG. 1, additional logic 103 is added in the corners of the device. Logic 103 performs functions that were present in dedicated logic on the FPGA, but that are not necessarily available in dedicated logic in gate arrays. These functions include well-known dedicated FPGA-specific functions such as boundary scan control logic, configuration logic, power-on reset circuitry, one or more phase-lock loops, an on-chip oscillator, buffers for clocks and other global signals, and a reference voltage generator.

Programmable I/O Cell

Figure 2:
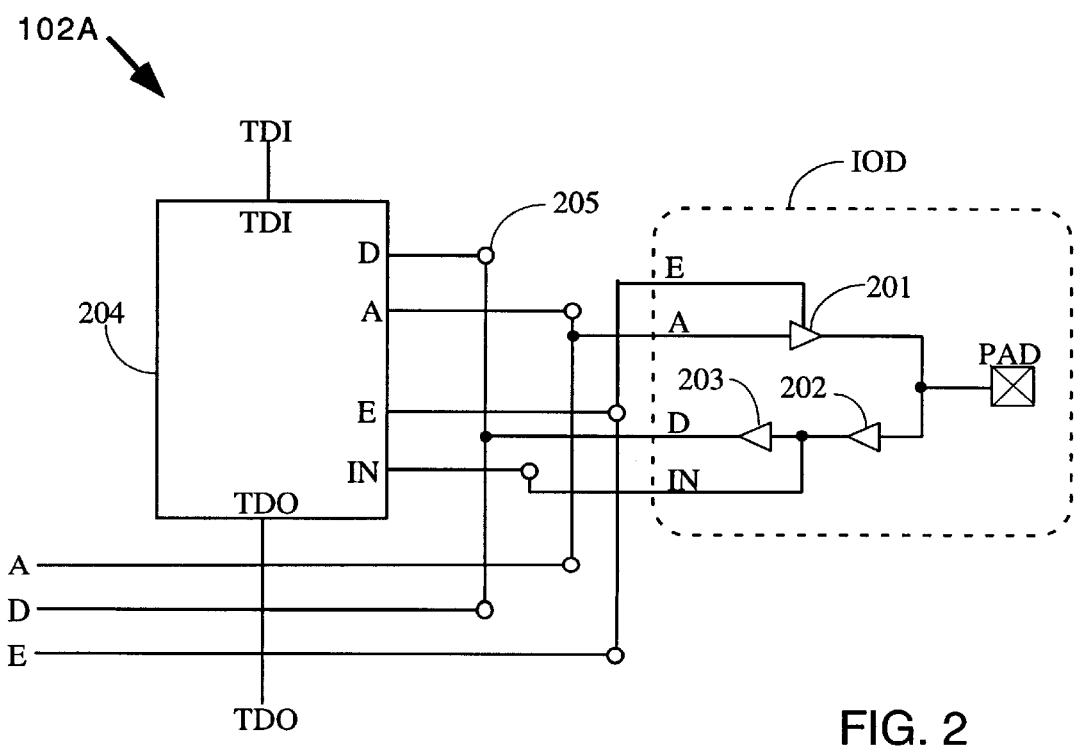
FIG. 2 shows an I/O cell capable of emulating the I/O characteristics of any of several FPGA families.

FIG. 2 shows an I/O cell capable of emulating the I/O characteristics of any of several FPGA families. (Details of the I/O driver logic are shown in FIGS. 2A–2E.) The IC layout of I/O cell 102A in FIG. 2 may be somewhat different from the layout of an FPGA I/O, partly because of the different method of programming (mask programmable instead of software programmable), and partly because this I/O cell supports the special features of several different FPGA families. However, the I/O characteristics are similar, i.e., the differences are small enough not to affect system functionality when the HardWire device is substituted for the emulated FPGA.

I/O cell 102A of FIG. 2 includes an I/O driver cell (IOD), which comprises an I/O pad, a tristatable output buffer 201 driving the pad with data A and enabled by enable signal E, input buffer 202 driven by the pad and driving signal IN, which drives buffer 203 to produce buffered signal D. The I/O cell of this embodiment also includes electrostatic discharge (ESD) protection circuitry (not shown), and boundary scan cell 204. (In some embodiments, the I/O cell does not include a boundary scan cell.) Boundary scan cell 204 interfaces with signals D, A, E, and IN through programmable metal tracks. For example, if a programmable connection is made at point 205, signal "D" is provided to boundary scan cell 204. Boundary scan cell 204 contributes to the boundary scan data chain by taking in data input TDI and supplying data output TDO. In some embodiments, the boundary scan data chain can programmably bypass boundary scan cell 204. This capability is used, for example, when emulating FPGAs without boundary scan capability such as Xilinx XC3000 Series devices. Note that boundary scan cell 204 does not include the boundary scan control logic, which in one embodiment is located in one corner of the device (103 in FIG. 1). The boundary scan control logic generates well-known global signals for controlling the boundary scan cells such as cell 204.

In one embodiment, some I/O cells on the HardWire device include boundary scan cells and some I/O cells do not. Boundary scan cells are eliminated from I/O cells near the corners of the HardWire device to save silicon area and to increase routability between the core and the corner logic 103 and between the core and the corner I/O cells.

Detailed Description of a First Embodiment

Programmable I/O Driver

Figure 2A:
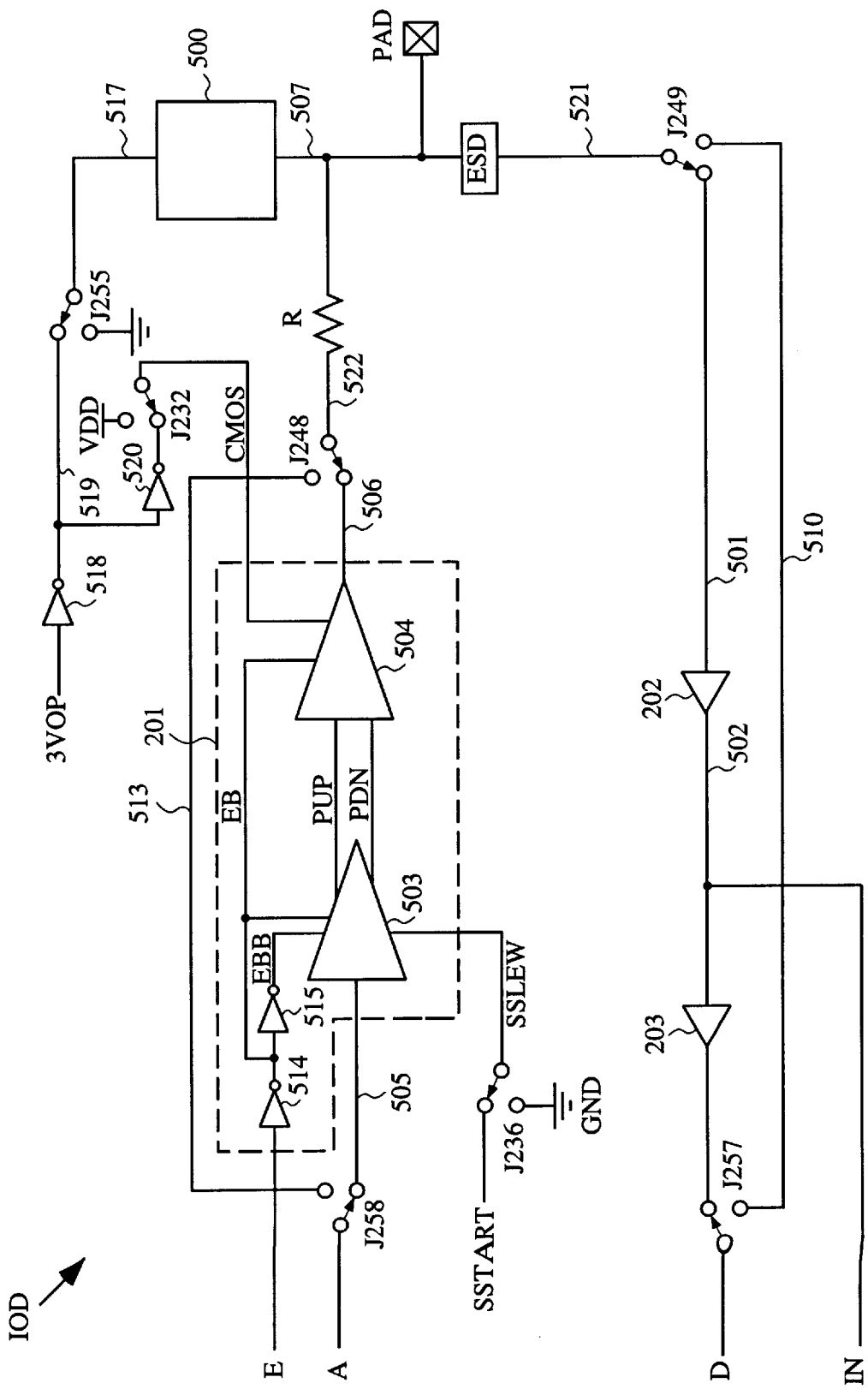
FIG. 2A is a schematic representation of a programmable I/O driver cell (IOD).

FIG. 2A shows one embodiment of a programmable I/O driver cell (IOD). FIGS. 2B–2E show details of the IOD of FIG. 2A. FIGS. 2A–2E include several programmable "switches" that determine which options are selected. The special features supported by the embodiment of FIGS. 2A–2E are shown in the following table.

| Feature | Programmable Options |
| --- | --- |
| Source currents (IOH) | 4 or 8 mA |
| Sink currents (IOL) | 4, 8, 12, or 24 mA |
| Slew rates | Fast or Slow |
| SoftEdge | On or Off |
| Output levels | CMOS or TTL |
| Input levels | CMOS or TTL |
| Pullup on pad | On or Off |
| Pulldown on pad | On or Off |
| Input path | Direct or Buffered |
| Output path | Direct or Buffered |
| Tolerates higher input voltage | On or Off |

SoftEdge slew rate capability is the ability to turn off one or more output drivers to reduce the output drive to about 4 mA when the falling edge output level approaches ground. The Xilinx XC4000H family of FPGAs has this capability, as described on page 2–82 of the Xilinx 1993 Data Book entitled "The Programmable Logic Data Book" (hereinafter referred to as "the Xilinx 1993 Data Book"), published 1993, available from Xilinx, Inc., 2100 Logic Drive, San Jose, Calif. 95124, which page is incorporated herein by reference.

The capability of programmably selecting each of these options allows the I/O cell of FIGS. 2A–2E to emulate the special features of at least the following Xilinx FPGA device families: XC3000A, XC3100A, XC4000E, XC4000EX, XC4700, XC5200, and XC6200, as well as the Xilinx XC9500 family of PLDs. (Note that the invention can be applied to PLDs and other programmable ICs as well as to FPGAs.) In this embodiment, the programmable input delay supported by some of the Xilinx FPGA families is emulated by inserting a delay in the core. In another embodiment, one or more programmable delay elements are included in the I/O cell and are programmably bypassed or included in the input path. In another embodiment, additional capacitance is programmably added in the I/O cell to one or more lines on the input path.

To emulate any of the supported FPGAs, the ESD protection structure is that of the FPGA family which provides the greatest protection against electrostatic discharge.

The I/O cell of this embodiment is designed to operate at either 3.3 volts or 5 volts, to match this capability in at least one of the supported FPGAs. In other embodiments, other voltage levels are supported. Because of this capability, the HardWire device can be used by a system designer who wishes to convert a board from one operating voltage to another.

In one embodiment, the IOD can be programmed to provide a power supply pad, either VDD or ground, by utilizing much of the available area in a large metal connection between the pad and the appropriate power ring.

Programmable Switches Select I/O Options

The following tables show the positions in which the switches of FIGS. 2A–2E should be placed in order to generate the available programmable options for the IOD. The entry "OPT" below the number of the switch means the switch is programmed to be in the position shown in the corresponding figure. The entry "OPTB" means the switch is programmed in the alternative position (the position not shown in the corresponding figure).

Figure 2B:
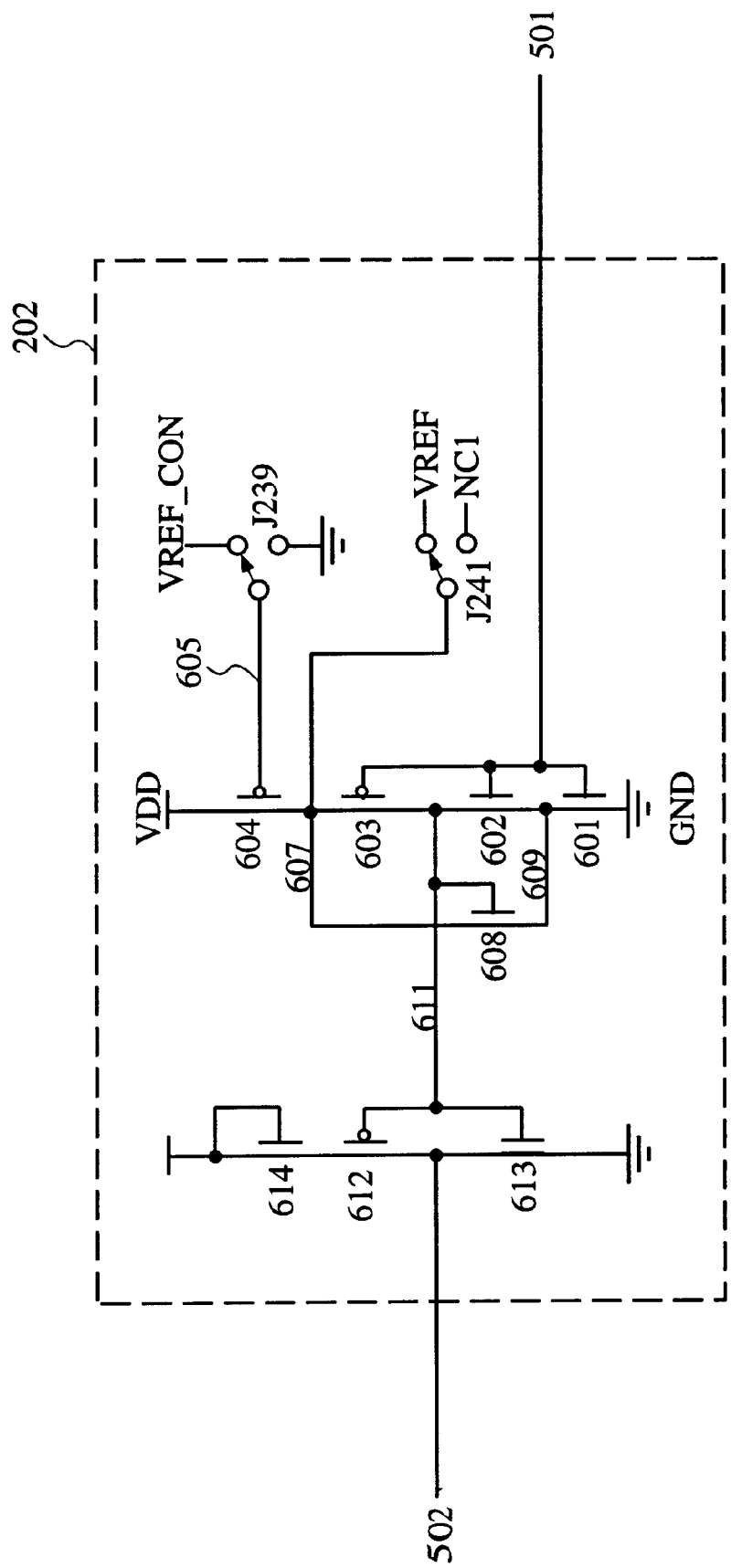
FIG. 2B is a schematic representation of the programmable input buffer of the embodiment of FIG. 2A.
Figure 2C:
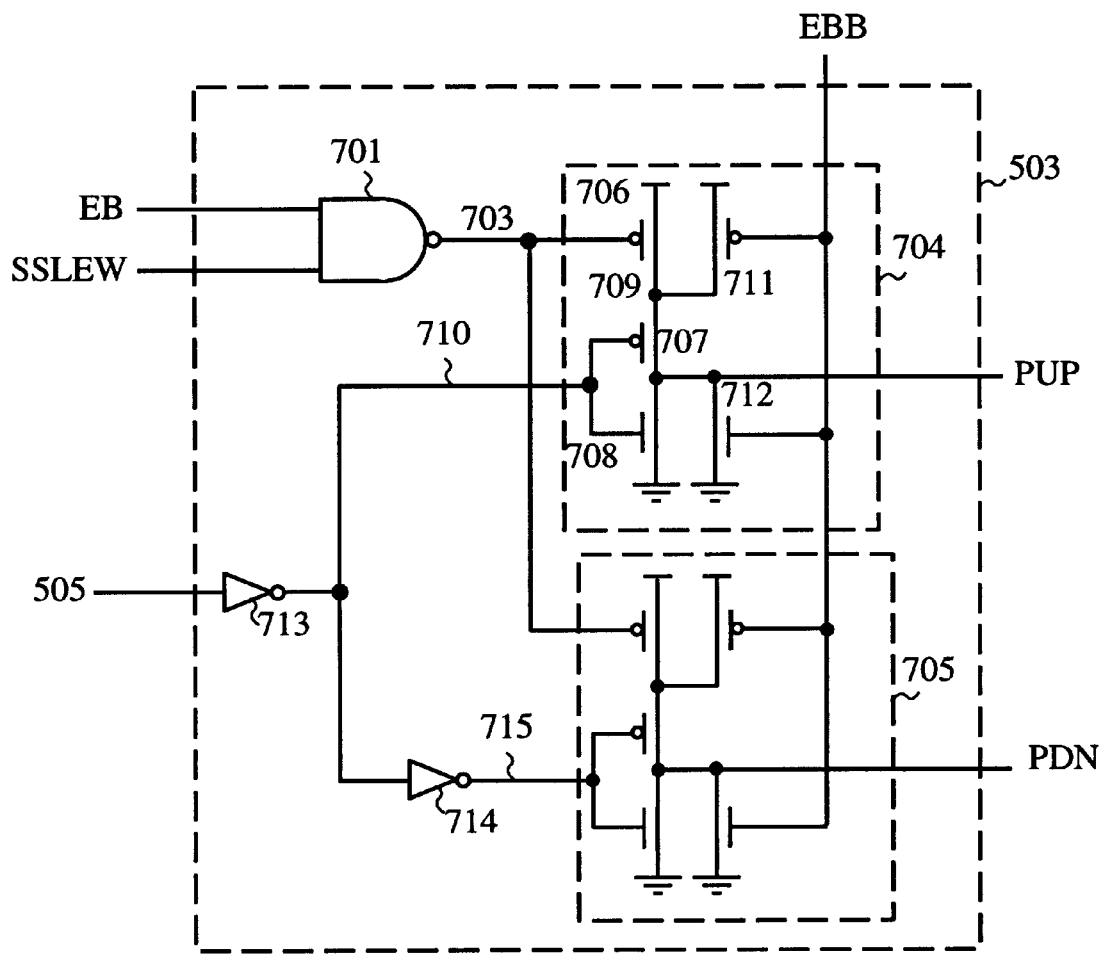
FIG. 2C is a schematic representation of the output pre-driver of the embodiment of FIG. 2A.
Figure 2D:
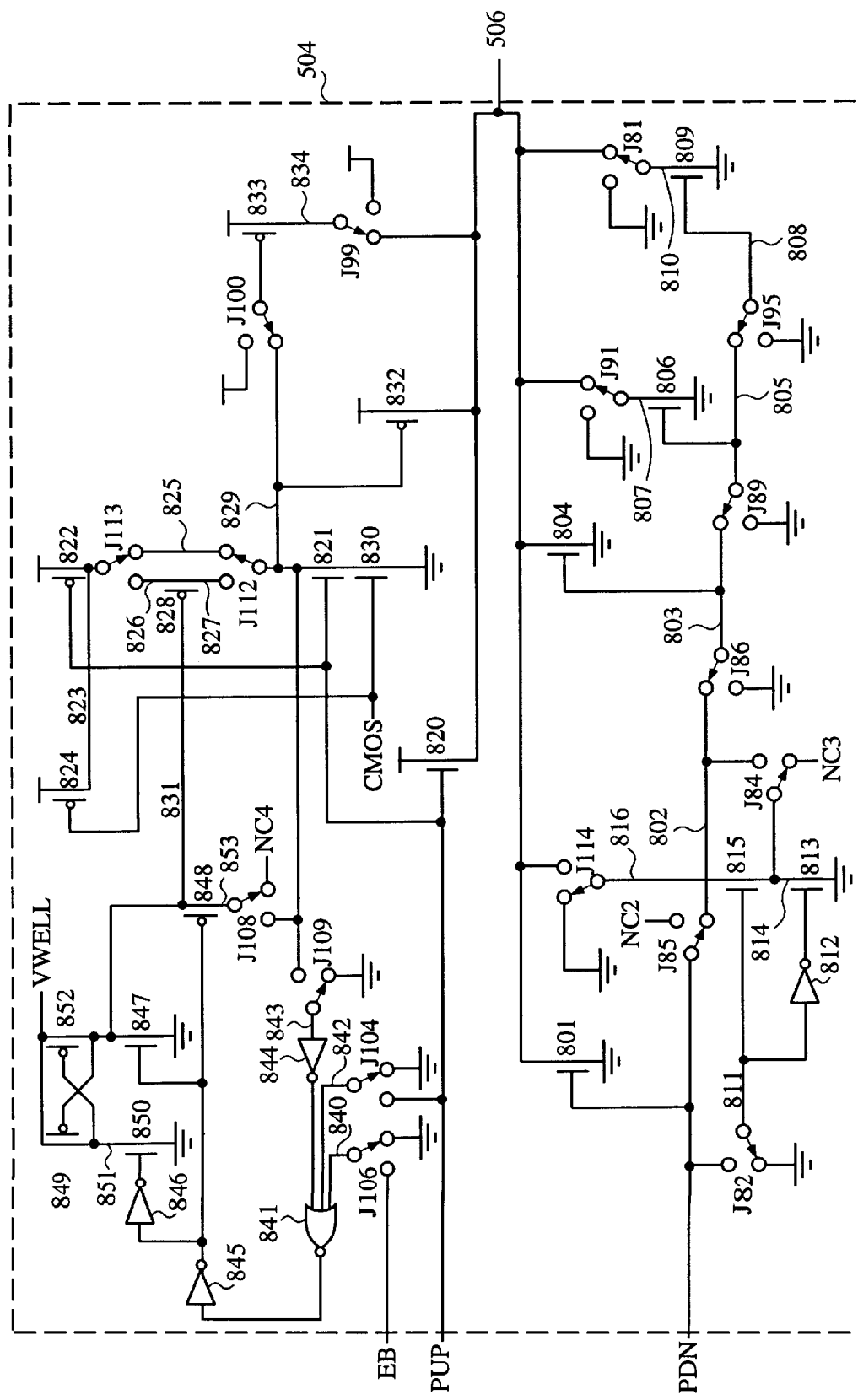
FIG. 2D is a schematic representation of the programmable output driver of the embodiment of FIG. 2A.
Figure 2E:
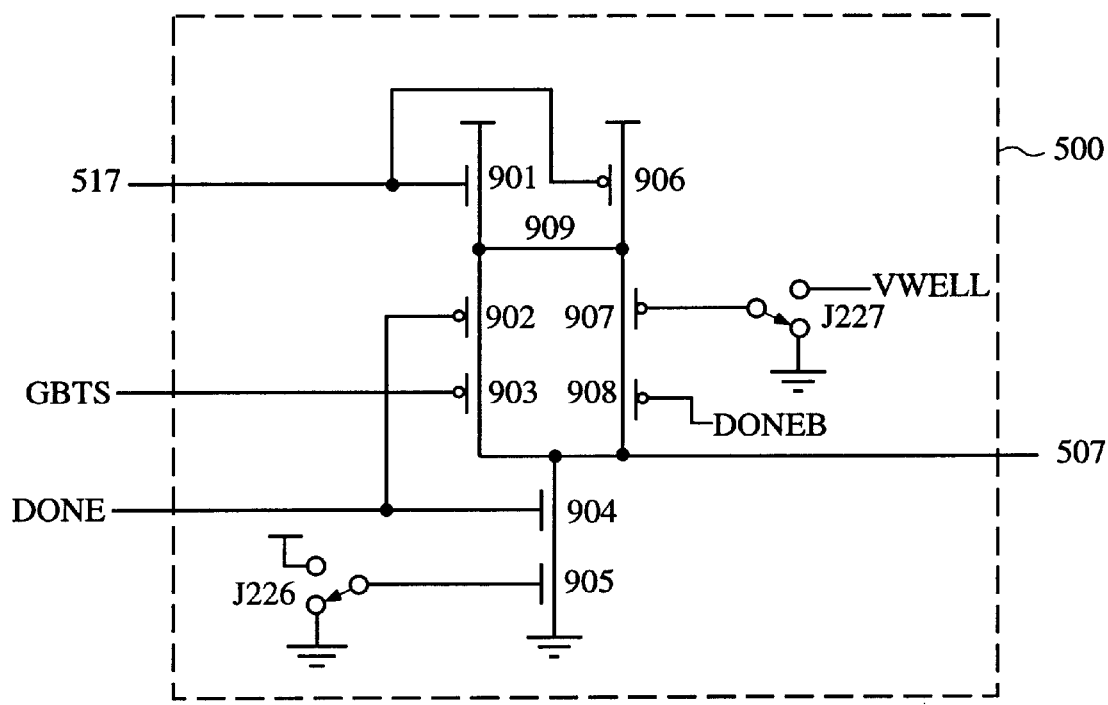
FIG. 2E is a schematic representation of a programmable circuit included in the embodiment of FIG. 2A.

The following two tables apply to switches in FIGS. 2A, 2B, and 2E. (The second table is a continuation of the first.) The name in the "Programmable Options" column denotes: CMOS or TTL input levels (CI or TI), CMOS or TTL output levels (CO or TO), slow or fast output slew rate (SLOW or FAST), and the presence of a pullup or pulldown after configuration (PU, PD, or neither). (The term "after configuration" is used herein to mean when the HardWire device is emulating a configured FPGA.) For example, the option name CI_TO_SLOW means the I/O to be emulated had a CMOS input level, a TTL output level, a slow output slew rate, and no pullup or pulldown after configuration. DIRECT_IN means the input from the pad bypasses buffers 202 and 203, i.e., in FIG. 2A signal line 510 passes the input from line 521 to the D terminal. DIRECT_OUT means output buffer 201 is bypassed via signal line 513. DIRECT_IN_OUT means all of buffers 202, 203, and 201 are bypassed. The labels at the tops of the columns denote switches as labeled in FIGS. 2A, 2B, and 2E, and group the switches by related functionality.

| PROGRAMMABLE | DIRECT OUT | | DIRECT IN | | TTL/CMOS IN | |
|---|---|---|---|---|---|---|
| OPTIONS | J258 | J248 | J257 | J249 | J239 | J241 |
| CI_TO_SLOW | OPT | OPT | OPT | OPT | OPTB | OPTB |
| CI_TO_FAST | OPT | OPT | OPT | OPT | OPTB | OPTB |
| TI_TO_SLOW | OPT | OPT | OPT | OPT | OPT | OPT |
| TI_TO_FAST | OPT | OPT | OPT | OPT | OPT | OPT |
| CI_TO_SLOW_PU | OPT | OPT | OPT | OPT | OPTB | OPTB |
| CI_TO_FAST_PU | OPT | OPT | OPT | OPT | OPTB | OPTB |
| TI_TO_SLOW_PU | OPT | OPT | OPT | OPT | OPT | OPT |
| TI_TO_FAST_PU | OPT | OPT | OPT | OPT | OPT | OPT |
| CI_TO_SLOW_PD | OPT | OPT | OPT | OPT | OPTB | OPTB |
| CI_TO_FAST_PD | OPT | OPT | OPT | OPT | OPTB | OPTB |
| TI_TO_SLOW_PD | OPT | OPT | OPT | OPT | OPT | OPT |
| TI_TO_FAST_PD | OPT | OPT | OPT | OPT | OPT | OPT |
| CI_CO_SLOW | OPT | OPT | OPT | OPT | OPTB | OPTB |
| CI_CO_FAST | OPT | OPT | OPT | OPT | OPTB | OPTB |
| TI_CO_SLOW | OPT | OPT | OPT | OPT | OPT | OPT |
| TI_CO_FAST | OPT | OPT | OPT | OPT | OPT | OPT |
| CI_CO_SLOW_PU | OPT | OPT | OPT | OPT | OPTB | OPTB |
| CI_CO_FAST_PU | OPT | OPT | OPT | OPT | OPTB | OPTB |
| TI_CO_SLOW_PU | OPT | OPT | OPT | OPT | OPTB | OPT |
| TI_CO_FAST_PU | OPT | OPT | OPT | OPT | OPT | OPT |
| CI_CO_SLOW_PD | OPT | OPT | OPT | OPT | OPTB | OPTB |
| CI_CO_FAST_PD | OPT | OPT | OPT | OPT | OPTB | OPTB |
| TI_CO_SLOW_PD | OPT | OPT | OPT | OPT | OPT | OPT |
| TI_CO_FAST_PD | OPT | OPT | OPT | OPT | OPT | OPT |
| DIRECT_IN | OPT | OPT | OPTB | OPTB | OPTB | OPTB |
| DIRECT_OUT | OPTB | OPTB | OPT | OPT | OPTB | OPTB |
| DIRECT_IN_OUT | OPTB | OPTB | OPTB | OPTB | OPTB | OPTB |

| PROGRAMMABLE | TTL/CMOS OUT | | FAST/SLOW SLEW | PULLUP/DOWN | |
|---|---|---|---|---|---|
| OPTIONS | J232 | J255 | J236 | J227 | J226 |
| CI_TO_SLOW | OPT | OPT | OPTB | OPTB | OPT |
| CI_TO_FAST | OPT | OPT | OPT | OPTB | OPT |
| TI_TO_SLOW | OPT | OPT | OPTB | OPTB | OPT |
| TI_TO_FAST | OPT | OPT | OPT | OPTB | OPT |
| CI_TO_SLOW_PU | OPT | OPT | OPTB | OPT | OPT |
| CI_TO_FAST_PU | OPT | OPT | OPT | OPT | OPT |
| TI_TO_SLOW_PU | OPT | OPT | OPTB | OPT | OPT |
| TI_TO_FAST_PU | OPT | OPT | OPT | OPT | OPT |
| CI_TO_SLOW_PD | OPT | OPT | OPTB | OPTB | OPTB |
| CI_TO_FAST_PD | OPT | OPT | OPT | OPTB | OPTB |
| TI_TO_SLOW_PD | OPT | OPT | OPTB | OPTB | OPTB |
| TI_TO_FAST_PD | OPT | OPT | OPT | OPTB | OPTB |

-continued

| | | | | | |
|---|---|---|---|---|---|
| CI_CO_SLOW | OPTB | OPTB | OPTB | OPTB | OPT |
| CI_CO_FAST | OPTB | OPTB | OPT | OPTB | OPT |
| TI_CO_SLOW | OPTB | OPTB | OPTB | OPTB | OPT |
| TI_CO_FAST | OPTB | OPTB | OPT | OPTB | OPT |
| CJ_CO_SLOW_PU | OPTB | OPTB | OPTB | OPT | OPT |
| CI_CO_FAST_PU | OPTB | OPTB | OPT | OPT | OPT |
| TI_CO_SLOW_PU | OPTB | OPTB | OPTB | OPT | OPT |
| TI_CO_FAST_PU | OPTB | OPTB | OPT | OPT | OPT |
| CI_CO_SLOW_PD | OPTB | OPTB | OPTB | OPTB | OPTB |
| CI_CO_FAST_PD | OPTB | OPTB | OPT | OPTB | OPTB |
| TI_CO_SLOW_PD | OPTB | OPTB | OPTB | OPTB | OPTB |
| TI_CO_FAST_PD | OPTB | OPTB | OPT | OPTB | OPTB |
| DIRECT_IN | OPTB | OPTB | OPTB | OPTB | OPT |
| DIRECT_OUT | OPTB | OPTB | OPTB | OPTB | OPT |
| DIRECT_IN_OUT | OPTB | OPTB | OPTB | OPTB | OPT |

The following two tables apply to switches in FIG. 2D. (The second table is a continuation of the first.) The name in the "Programmable Options" column denotes: having SoftEdge capability or not (SE or NS), inputs tolerant of a higher input voltage or not (TOL or NONTOL), output low current (commonly known as IOL) in milliamps, and output high current (commonly known as IOH) in milliamps. For example, the option name SE_NONTOL_4_8 means the I/O to be emulated has SoftEdge capability, is not tolerant of a higher input voltage, has an IOL of 4 mA and an IOH of 8 mA.

| PROGRAMMABLE | TOLERANCE | | | | | | SOFTEDGE | | |
|---|---|---|---|---|---|---|---|---|---|
| OPTIONS | J104 | J106 | J108 | J109 | J112 | J113 | J82 | J84 | J114 |
| SE_NONTOL_4_4 | OPTB | OPTB | OPTB | OPTB | OPT | OPT | OPT | OPTB | OPT |
| SE_NONTOL_4_8 | OPTB | OPTB | OPTB | OPTB | OPT | OPT | OPT | OPTB | OPT |
| SE_TOL_4_4 | OPT | OPT | OPT | OPT | OPTB | OPTB | OPT | OPTB | OPT |
| SE_TOL_4_8 | OPT | OPT | OPT | OPT | OPTB | OPTB | OPT | OPTB | OPT |
| SE_NONTOL_8_4 | OPTB | OPTB | OPTB | OPTB | OPT | OPT | OPT | OPTB | OPT |
| SE_NONTOL_8_8 | OPTB | OPTB | OPTB | OPTB | OPT | OPT | OPT | OPTB | OPT |
| SE_TOL_8_4 | OPT | OPT | OPT | OPT | OPTB | OPTB | OPT | OPTB | OPT |
| SE_TOL_8_8 | OPT | OPT | OPT | OPT | OPTB | OPTB | OPT | OPTB | OPT |
| SE_NONTOL_12_4 | OPTB | OPTB | OPTB | OPTB | OPT | OPT | OPT | OPTB | OPT |
| SE_NONTOL_12_8 | OPTB | OPTB | OPTB | OPTB | OPT | OPT | OPT | OPTB | OPT |
| SE_TOL_12_4 | OPT | OPT | OPT | OPT | OPTB | OPTB | OPT | OPTB | OPT |
| SE_TOL_12_8 | OPT | OPT | OPT | OPT | OPTB | OPTB | OPT | OPTB | OPT |
| SE_NONTOL_24_4 | OPTB | OPTB | OPTB | OPTB | OPT | OPT | OPT | OPTB | OPT |
| SE_NONTOL_24_8 | OPTB | OPTB | OPTB | OPTB | OPT | OPT | OPT | OPTB | OPT |
| SE_TOL_24_4 | OPT | OPT | OPT | OPT | OPTB | OPTB | OPT | OPTB | OPT |
| SE_TOL_24_8 | OPT | OPT | OPT | OPT | OPTB | OPTB | OPT | OPTB | OPT |
| NS_NONTOL_4_4 | OPTB | OPTB | OPTB | OPTB | OPT | OPT | OPTB | OPT | OPTB |
| NS_NONTOL_4_8 | OPTB | OPTB | OPTB | OPTB | OPT | OPT | OPTB | OPT | OPTB |
| NS_TOL_4_4 | OPT | OPT | OPT | OPT | OPTB | OPTB | OPTB | OPT | OPTB |
| NS_TOL_4_8 | OPT | OPT | OPT | OPT | OPTB | OPTB | OPTB | OPT | OPTB |
| NS_NONTOL_8_4 | OPTB | OPTB | OPTB | OPTB | OPT | OPT | OPTB | OPT | OPTB |
| NS_NONTOL_8_8 | OPTB | OPTB | OPTB | OPTB | OPT | OPT | OPTB | OPT | OPTB |
| NS_TOL_8_4 | OPT | OPT | OPT | OPT | OPTB | OPTB | OPTB | OPT | OPTB |
| NS_TOL_8_8 | OPT | OPT | OPT | OPT | OPTB | OPTB | OPTB | OPT | OPTB |
| NS_NONTOL_12_4 | OPTB | OPTB | OPTB | OPTB | OPT | OPT | OPTB | OPT | OPTB |
| NS_NONTOL_12_8 | OPTB | OPTB | OPTB | OPTB | OPT | OPT | OPTB | OPT | OPTB |
| NS_TOL_12_4 | OPT | OPT | OPT | OPT | OPTB | OPTB | OPTB | OPT | OPTB |
| NS_TOL_12_8 | OPT | OPT | OPT | OPT | OPTB | OPTB | OPTB | OPT | OPTB |
| NS_NONTOL_24_4 | OPTB | OPTB | OPTB | OPTB | OPT | OPT | OPTB | OPT | OPTB |
| NS_NONTOL_24_8 | OPTB | OPTB | OPTB | OPTB | OPT | OPT | OPTB | OPT | OPTB |
| NS_TOL_24_4 | OPT | OPT | OPT | OPT | OPTB | OPTB | OPTB | OPT | OPTB |
| NS_TOL_24_8 | OPT | OPT | OPT | OPT | OPTB | OPTB | OPTB | OPT | OPTB |

| PROGRAMMABLE | IOH | | IOL | | | | | |
|---|---|---|---|---|---|---|---|---|
| OPTIONS | J99 | J100 | J81 | J95 | J85 | J86 | J89 | J91 |
| SE_NONTOL_4_4 | OPTB | OPTB | OPTB | OPTB | OPTB | OPTB | OPTB | OPTB |
| SE_NONTOL_4_8 | OPT | OPT | OPTB | OPTB | OPTB | OPTB | OPTB | OPTB |
| SE_TOL_4_4 | OPTB | OPTB | OPTB | OPTB | OPTB | OPTB | OPTB | OPTB |
| SE_TOL_4_8 | OPT | OPT | OPTB | OPTB | OPTB | OPTB | OPTB | OPTB |
| SE_NONTOL_8_4 | OPTB | OPTB | OPTB | OPTB | OPTB | OPT | OPTB | OPTB |
| SE_NONTOL_8_8 | OPT | OPT | OPTB | OPTB | OPTB | OPT | OPTB | OPTB |
| SE_TOL_8_4 | OPTB | OPTB | OPTB | OPTB | OPTB | OPT | OPTB | OPTB |
| SE_TOL_8_8 | OPT | OPT | OPTB | OPTB | OPTB | OPT | OPTB | OPTB |
| SE_NONTOL_12_4 | OPTB | OPTB | OPTB | OPTB | OPTB | OPT | OPT | OPT |
| SE_NONTOL_12_8 | OPT | OPT | OPTB | OPTB | OPTB | OPT | OPT | OPT |

-continued

| | | | | | | | | |
|---|---|---|---|---|---|---|---|---|
| SE_TOL_12_4    | OPTB | OPTB | OPTB | OPTB | OPTB | OPT  | OPT  | OPT  |
| SE_TOL_12_8    | OPT  | OPT  | OPTB | OPTB | OPTB | OPT  | OPT  | OPT  |
| SE_NONTOL_24_4 | OPTB | OPTB | OPT  | OPT  | OPTB | OPT  | OPT  | OPT  |
| SE_NONTOL_24_8 | OPT  | OPT  | OPT  | OPT  | OPTB | OPT  | OPT  | OPT  |
| SE_TOL_24_4    | OPTB | OPTB | OPT  | OPT  | OPTB | OPT  | OPT  | OPT  |
| SE_TOL_24_8    | OPT  | OPT  | OPT  | OPT  | OPTB | OPT  | OPT  | OPT  |
| NS_NONTOL_4_4  | OPTB | OPTB | OPTB | OPTB | OPTB | OPTB | OPTB | OPTB |
| NS_NONTOL_4_8  | OPT  | OPT  | OPTB | OPTB | OPTB | OPTB | OPTB | OPTB |
| NS_TOL_4_4     | OPTB | OPTB | OPTB | OPTB | OPTB | OPTB | OPTB | OPTB |
| NS_TOL_4_8     | OPT  | OPT  | OPTB | OPTB | OPTB | OPTB | OPTB | OPTB |
| NS_NONTOL_8_4  | OPTB | OPTB | OPTB | OPTB | OPT  | OPT  | OPTB | OPTB |
| NS_NONTOL_8_8  | OPT  | OPT  | OPTB | OPTB | OPT  | OPT  | OPTB | OPTB |
| NS_TOL_8_4     | OPTB | OPTB | OPTB | OPTB | OPT  | OPT  | OPTB | OPTB |
| NS_TOL_8_8     | OPT  | OPT  | OPTB | OPTB | OPT  | OPT  | OPTB | OPTB |
| NS_NONTOL_12_4 | OPTB | OPTB | OPTB | OPTB | OPT  | OPT  | OPT  | OPT  |
| NS_NONTOL_12_8 | OPT  | OPT  | OPTB | OPTB | OPT  | OPT  | OPT  | OPT  |
| NS_TOL_12_4    | OPTB | OPTB | OPTB | OPTB | OPT  | OPT  | OPT  | OPT  |
| NS_TOL_12_8    | OPT  | OPT  | OPTB | OPTB | OPT  | OPT  | OPT  | OPT  |
| NS_NONTOL_24_4 | OPTB | OPTB | OPT  | OPT  | OPT  | OPT  | OPT  | OPT  |
| NS_NONTOL_24_8 | OPT  | OPT  | OPT  | OPT  | OPT  | OPT  | OPT  | OPT  |
| NS_TOL_24_4    | OPTB | OPTB | OPT  | OPT  | OPT  | OPT  | OPT  | OPT  |
| NS_TOL_24_8    | OPT  | OPT  | OPT  | OPT  | OPT  | OPT  | OPT  | OPT  |

The programmable switches referenced in the above tables are shown in FIGS. 2A–2E as three circles interconnectable by an arrow that can assume either of two positions. For example, in FIG. 2A switches J249 and J257 can be set so that the input signal either traverses or bypasses the input buffers. As shown in FIG. 2A, the input signal traverses the input buffers. This option selection is shown in one of the above tables as J257=OPT, J249=OPT. To bypass the input buffers, thereby selecting the DIRECT_IN option, the switches are set as follows: J257=OPTB, J249=OPTB.

The embodiment of FIG. 2A has additional programmable features not shown in FIG. 2. Switches J232 and J255 can be set so that either TTL or CMOS output levels are provided. In the switch positions shown in FIG. 2A, TTL output levels are selected. Switches J258 and J248 can be set so that the output data either traverses or bypasses the output buffer. Switches J258 and J248 therefore provide the DIRECT_OUT capability of the tables above. As shown in FIG. 2A, data signal A passes through output buffer 201. Switch J236 selects a fast or slow output slew rate. As shown in FIG. 2A, a fast slew rate is selected.

Detailed Description of Programmable I/O Driver

On the input path, pad line 507 traverses an ESD device to line 521. Switch J249 selects either line 501 (shown selected in FIG. 2A) or line 510 to connect to line 521. Line 501 drives input buffer 202, which drives signal 502 (IOD output IN) and buffer 203. Switch J257 selects between line 510 and the output of buffer 203 (shown selected) and places the selected signal on IOD output D.

On the output path, data signal A is connected via switch J258 to either line 505 (shown selected), which drives output buffer 201, or to signal line 513, which bypasses output buffer 201. Switch J248 selects either output line 506 (shown selected) of output buffer 201 or line 513 to drive line 522. Line 522 and pad line 507 are connected through resistor R.

Output buffer 201 comprises pre-driver 503 and output driver 504. Switch J236 selects between signal SSTART (shown selected) and ground (GND) and provides the selected signal to pre-driver 503 on line SSLEW. When connected, signal SSTART controls the Soft Start-up capability as supported by Xilinx XC3000A FPGAs, as described on page 4–309 of the Xilinx 1996 Data Book, which page is incorporated herein by reference. Soft Start-up is a mechanism for reducing current drawn by I/Os as they switch on after configuration. Enable signal E is inverted by inverter 514 to drive signal EB, which drives both pre-driver 503 and output driver 504. Signal EB is inverted by inverter 515 to drive signal EBB, which drives pre-driver 503. Signal 3VOP is a global control signal used to select low or high voltage (e.g., 3.3 or 5 volt) operation of the I/O driver. Signal 3VOP drives inverter 518 to generate signal 519, which drives inverter 520. Switch J232 selects between power high (VDD) and the output of inverter 520 (shown selected) and provides the selected signal to signal CMOS, which is provided to output driver 504. Switch J255 selects between ground and the signal on line 519 (shown selected) to drive signal line 517, which is an input to circuit 500. Pre-driver 503 generates pullup signal PUP and pulldown signal PDN, both of which drive output driver 504. The output 506 of output driver 504 programmably passes through switch J248 and resistor R to pad line 507 and hence to the pad.

Circuit 500 performs several functions, including threshold adjustment and providing pullup and pulldown resistors, and is described in detail in reference to FIG. 2E.

Programmable Input Buffer

FIG. 2B shows programmable input buffer 202 of the embodiment of FIG. 2A. The position of switches J239 and J241 determines whether CMOS or TTL input levels are detected. As shown in FIG. 2B, the TTL option is selected.

In FIG. 2B, input signal 501 drives N-channel transistors 601 and 602 and P-channel transistor 603. P-channel transistors 604, 603, and N-channel transistors 602, 601 (in that order) form a path from power high (VDD) to ground (GND). Transistor 604 is driven by signal line 605, which can be connected through switch J239 to either ground or VREF_CON (shown selected). VREF_CON is a global control signal from voltage control logic that in one embodiment is placed in one corner of the device. In one embodiment, switch J239 is not present in every I/O cell, but is included in the corner logic. Line 607 between transistors 603 and 604 is connected through N-channel transistor 608 to the line 609 between transistors 602 and 601. In some embodiments, a capacitor is included between line 607 and ground. Line 607 is also connected through switch J241 to either VREF (shown selected) or an unconnected line NC1. VREF is a global signal that supplies a reference voltage for the IOD, created in one embodiment by a voltage reference generator located in one corner of the device. In one embodiment, switch J241 is not present in every I/O cell, but is included in the corner logic. Transistor 608 is driven by the line 611 between transistors 602 and 603, which also drives P-channel transistor 612 and N-channel transistor 613. N-channel transistor 614 (which is driven by VDD) and transistors 612, 613 (in that order) form a path from power high to ground. Line 502 between transistors 612 and 613 provides the output of input buffer 202.

Output Pre-Driver

FIG. 2C shows output pre-driver 503 of FIG. 2A. Input signals SSLEW and EB drive NAND-gate 701. NAND-gate 701 generates signal 703, which drives P-channel transistor 706 in circuit 704. P-channel transistors 706, 707, and N-channel transistor 708 (in that order) form a path from power high to ground. Line 709 between transistors 706 and 707 is also connected to power high through P-channel transistor 711, which is driven by signal EBB. Signal PUP between transistors 707 and 708 is also connected to ground through N-channel transistor 712, which is driven by signal EBB. Transistors 707 and 708 are driven by line 710, which is driven by signal 505 through inverter 713. Line 710 also drives inverter 714, which drives line 715. Circuit 705 is substantially similar to circuit 704, except that circuit 705 is driven by line 715 instead of line 710, and generates signal PDN instead of signal PUP. In one embodiment, the pre-driver is programmable and controls the slew rate.

Programmable Output Driver

FIG. 2D shows programmable output driver 504 of FIG. 2A. Signal PDN traverses a series of switches to turn on one or more of several pulldowns on output signal line 506. The selection of these switch positions determines the falling edge output characteristics of output buffer 201. Switches J104, J106, J108, J109, J112, and J113 determine whether or not the I/O cell is tolerant of a higher input voltage than the operating voltage of the device. For example, a device operating at 3.3 volts may be programmed to be tolerant of 5 volt inputs using these switches. Switches J82, J84, and J114 determine whether or not an I/O has SoftEdge capability. Switches J99 and J100 determine the IOH of the I/O. As shown in FIG. 2D, IOH is set to 8 mA. Switches J81, J95, J85, J86, J89, and J91 determine the IOL of the I/O. As shown in FIG. 4D, IOL is set to 24 mA.

Signal PUP controls several pullups on output line 506. These pullups also pull to various power high levels depending on the positions of programmable switches. The selection of these switch positions determines the rising edge output characteristics of output buffer 201.

Detailed Description of Programmable Output Driver

In FIG. 2D, signal PDN drives N-channel pulldown 801 on line 506. Switch J85 connects signal PDN to either line 802 (shown selected) or unconnected line NC2. Switch J86 selects between the signal on line 802 (shown selected) and ground and places the selected signal on line 803, which drives N-channel pulldown 804 on line 506. Switch J89 selects between the signal on line 803 (shown selected) and ground and places the selected signal on line 805, which drives N-channel pulldown 806 on line 807. Switch J91 selects between the signal on line 506 (shown selected) and ground and places the selected signal on line 807. Switch J95 selects between the signal on line 805 (shown selected) and ground and places the selected signal on line 808, which drives N-channel pulldown 809 on line 810. Switch J81 selects between the signal on line 506 (shown selected) and ground and places the selected signal on line 810. Switch J82 selects between signal PDN and ground (shown selected) and places the selected signal on line 811, which drives inverter 812. Inverter 812 drives N-channel pulldown 813 on line 814. Switch J84 selects between the signal on line 802 and unconnected line NC3 (shown selected) and places the selected signal on line 814. Line 811 drives N-channel transistor 815 between line 814 and line 816. Switch J114 selects between the signal on line 506 and ground (shown selected) and places the selected signal on line 816.

Signal PUP drives N-channel pullup 820 on output line 506, as well as N-channel transistor 821 and P-channel transistor 822. Transistor 822 provides a pullup to line 823, which is also pulled up by P-channel transistor 824. Transistor 824 is driven by signal CMOS of FIG. 2A. Switch J113 connects line 823 to either of lines 825 (shown selected) or 826. Line 826 is connected to line 827 through P-channel transistor 828, which is driven by line 831. Switch J112 selects between lines 825 (shown selected) and 827 and connects the selected line to line 829. Line 829 is pulled to ground through transistors 821 and 830 in series. N-channel transistor 830 is driven by signal CMOS. Line 829 drives P-channel pullup 832 on output line 506. Switch J100 selects between power high and the signal on line 829 (shown selected) and uses the selected signal to drive P-channel pullup 833 on line 834. Switch J99 selects between power high and the signal on output line 506 (shown selected) and provides the selected signal to line 834.

Switch J106 selects between ground (shown selected) and signal EB of FIG. 2A and places the selected signal on line 840, which drives 3-input NOR-gate 841. Switch J104 selects between ground (shown selected) and signal PUP and places the selected signal on line 842, which also drives NOR-gate 841. Switch J109 selects between ground (shown selected) and the signal on line 829 and places the selected signal on line 843, which drives inverter 844. The output of inverter 844 provides the third input to NOR-gate 841, which drives inverter 845. Inverter 845 drives inverter 846, N-channel transistor 847, and P-channel transistor 848. P-channel transistor 849 and N-channel transistor 850 form a path from global line VWELL to ground. Transistor 850 is gated by inverter 846. Line 851 between transistors 849 and 850 drives P-channel transistor 852. Transistors 852 and 847 form a path from line VWELL to ground. The line between transistors 852 and 847 is line 831, which is connected through transistor 848 to line 853. Switch J108 connects one of line 829 and unconnected line NC4 (shown selected) to line 853.

P-channel transistors associated with the output pullups are placed in an N-well connected to line VWELL, which is connected to the highest voltage on the device. Making this N-well connection is a well-known technique used to make an I/O circuit tolerant of a higher input voltage than the operating voltage of the device.

Programmable Output Circuit

FIG. 2E shows circuit 500 of FIG. 2A. Switch J227 selects whether a weak pullup is provided to the output pad (via line 507) after configuration. In the switch position shown in FIG. 2E, a weak pullup is provided. Switch J226 selects whether a weak pulldown is provided to the output pad (via line 507) after configuration. In the switch position shown in FIG. 2E, a weak pulldown is not provided.

In FIG. 2E, N-channel transistor 901, P-channel transistors 902, 903 and N-channel transistors 904, 905 (in that order) form a path from power high to ground. Pad line 507 is connected to the line between transistors 903 and 904. P-channel transistors 906, 907 and 908 (in that order) form a path from power high to pad line 507. The line 909 between transistors 906 and 907 is connected to the line between transistors 901 and 902. Transistors 901 and 906 are driven by the signal on line 517 (see also FIG. 2A). Transistors 902 and 904 are driven by the global signal DONE, which signals the end of configuration. Transistor 903 is driven by signal GBTS, which is a global tristate signal. Transistor 908 is driven by global signal DONEB, the inversion of signal DONE. Switch J227 selects one of ground (shown selected) and the signal on line VWELL and supplies it to the gate of transistor 907. Switch J226 selects one of power high and ground (shown selected) and supplies it to the gate of transistor 905.

Second aspect of the Invention

Overview

According to a second aspect of the invention, dedicated boundary scan logic is provided in the mask programmable I/O cell. There are several advantages to this approach. Custom layout of boundary scan logic requires only about half as much silicon area as implementing the same logic in core logic gates. This aspect of the invention also reduces the number of signals which must be routed through the outer portions of the core, thereby increasing routability in the core.

In one embodiment, for each programmable I/O cell two copies of the boundary scan logic are provided in two boundary scan cells. An I/O cell therefore comprises two boundary scan cells and one IOD. In an emulated FPGA every IOB is included in the boundary scan data chain, whether or not it is used as an I/O, and whether or not it is bonded out in the package. I/O drivers from such IOBs are not necessarily translated into IODs in the HardWire device, since it is an inefficient use of resources to do so. For example, if only the I/O register of an IOB is used, the register logic can be efficiently mapped into the HardWire core and a HardWire IOD need not be used. When the driver from an unbonded or unused IOB is not mapped into a HardWire IOD, an extra boundary scan cell must be inserted into the HardWire boundary scan chain as a "fake I/O", so that boundary scan readback will show the expected data. The second boundary scan cell provides this capability without consuming a second I/O cell. Therefore, a HardWire replacement can sometimes have fewer I/O cells than there are IOBs in the emulated FPGA. A smaller, cheaper Hard-Wire device can therefore be used than would otherwise be required. This technique can also be applied to mask programmable ICs other than the HardWire devices discussed herein. The technique can also be used in programmable ICs other than mask programmable ICs, such as in FPGAs and PLDs.

A boundary scan cell typically comprises three bits of a single continuous boundary scan data chain used to test the device. Boundary scan is described in the Xilinx Application Note XAPP017 version 1.1 entitled "Boundary Scan in XC4000 and XC5000 Series Devices", published Jul. 15, 1996, available from Xilinx, Inc., 2100 Logic Drive, San Jose, Calif. 95124, which is incorporated herein by reference.) An IEEE standard for boundary scan has also been established, and is described in "IEEE Standard Test Access Port and Boundary-Scan Architecture IEEE Std 1149.1-1990, Copyright 1993, (referred to hereinafter as the "IEEE Boundary Scan Standard"), published 1993 and available from The Institute of Electrical and Electronics Engineers, Inc., 345 East 47th Street, New York, N.Y. 10017. Chapters 3 and 10 of the IEEE Boundary Scan Standard are of particular help in understanding the invention.

Detailed Description of a Second Embodiment

Nine Cases are Supported

Providing two boundary scan cells per IOD makes it possible to duplicate the sequence of the boundary scan data chain in the boundary scan registers, even though a single HardWire product is used to emulate any of several FPGAs, each of which is produced in several packages. In order to support all bonding options in so many devices, the boundary scan cell must be programmable. The available options for one embodiment are as follows.

Case 1) The boundary scan logic is bypassed. This option is used, for example, when there are more boundary scan cells in the HardWire device than there are IOBs in the emulated FPGA.

Case 2) The boundary scan logic is used, and is connected to the IOD. This is the general case for a normal IOB that is bonded and used as an I/O in the emulated FPGA. Note that since Case 2 boundary scan cells are connected to the IOD, no two such cells can be placed in a single I/O cell.

Case 3) The boundary scan logic is used and is connected to the IOD, and an additional direct path is provided from the "D" terminal of the IOD to the core. This direct path is generally used for clocks.

Case 4) The boundary scan logic is used, but is not connected to the IOD. This case is used when emulating an unbonded FPGA IOB. For example, a Case 4 boundary scan cell could be combined with a Case 2 or 3 boundary scan cell in a single I/O cell. Such a combined block would emulate two adjacent IOBs in the emulated FPGA, where one IOB is bonded and the other is not.

Case 5) The boundary scan logic is used, but is not connected to the IOD, and an additional direct path is provided from the "D" terminal of the IOD to the core. Since this boundary scan cell is not connected to the IOD, this direct path is used when emulating an FPGA input pad that does not have boundary scan, such as the PROGRAM pin of Xilinx FPGAS. The PROGRAM pin is described on page 4–47 of the Xilinx 1996 Data Book, which page is incorporated herein by reference.

Case 6) The boundary scan logic is used, but is not connected to the IOD, and two additional direct paths are provided from the "A" and "E" terminals of the IOD to the core. Since this boundary scan cell is not connected to the IOD, these direct paths are used when emulating an FPGA output pad that does not have boundary scan, such as the FPGA test data out (TDO) pin. The TDO pin is described on page 4–48 of the Xilinx 1996 Data Book, which page is incorporated herein by reference.

Case 7) The boundary scan logic is used, but is not connected to the IOD, and three additional direct paths are provided from the "D", "A", and "E" terminals of the IOD to the core. Since this boundary scan cell is not connected to the IOD, these direct paths are used when emulating an FPGA bidirectional pad that does not have boundary scan, such as the DONE pin. The DONE pin is described on page 4–47 of the Xilinx 1996 Data Book, which page is incorporated herein by reference.

Case 8) Only the input bit of the boundary scan logic is used and is connected to the IOD. (The output and output tristate bits are programmably omitted from the boundary scan cell.) This case is used to emulate the M0 and M2 mode pins in Xilinx FPGAs. The mode pins are described on pages 4–47 and 4–54 of the Xilinx 1996 Data Book, which are incorporated herein by reference.

Case 9) All three bits of the boundary scan logic are used and the boundary scan logic is connected to the IOD. This case is used to emulate the M1 mode pin in Xilinx FPGA. This case differs from Case 2 in that additional connections are provided from the IOD to the core and the output and tristate boundary scan bits do not drive the IOD.

In one embodiment, the HardWire device can "swap the order" of I/O cells in the boundary scan data chain, or leave cells out of the chain entirely, by way of programmable tracks called MetaTrack™ lines. This capability allows the HardWire device to emulate an FPGA in virtually any package. Additionally, the HardWire device can change the pinout order and use a different package than the emulated FPGA, if desired by the user, while retaining the order of bits in the boundary scan data chain. MetaTrack lines are dedicated tracks for adding programmable interconnect lines. In this embodiment, the MetaTrack lines traverse each boundary scan cell, programmably connecting the data inputs and outputs of adjacent or non-adjacent boundary scan cells. In another embodiment, the MetaTrack lines are physically located outside the boundary scan cells, for example, in a ring between the cell and the core, or in the core itself. MetaTrack lines can be used in mask programmable ICs other than the HardWire devices discussed herein. MetaTrack lines can also be used in programmable ICs other than mask programmable ICs, such as in FPGAs and PLDs.

Providing MetaTrack lines in the I/O cells saves silicon area by reducing the number of required connections between the I/O cells and the core. This reduction in turn improves routability of other signals in this area of the device. The number of MetaTrack lines to be included is dependent on the flexibility required for the HardWire device. The more MetaTrack lines present, the more "U-turns" can be made in the boundary scan data chain. In one embodiment, five MetaTrack lines are provided.

In another embodiment, the data inputs and outputs can be programmably connected through the core, providing a potentially very large number of paths for swapping the order of boundary scan cells in the data chain. In one embodiment, additional boundary scan logic is implemented in the core and is programmably inserted into the boundary scan data chain. This embodiment can therefore emulate an arbitrarily long boundary scan data chain, mixing boundary scan logic in the I/O cells and the core in an arbitrary sequence.

Exemplary I/O Cell

Figure 3:
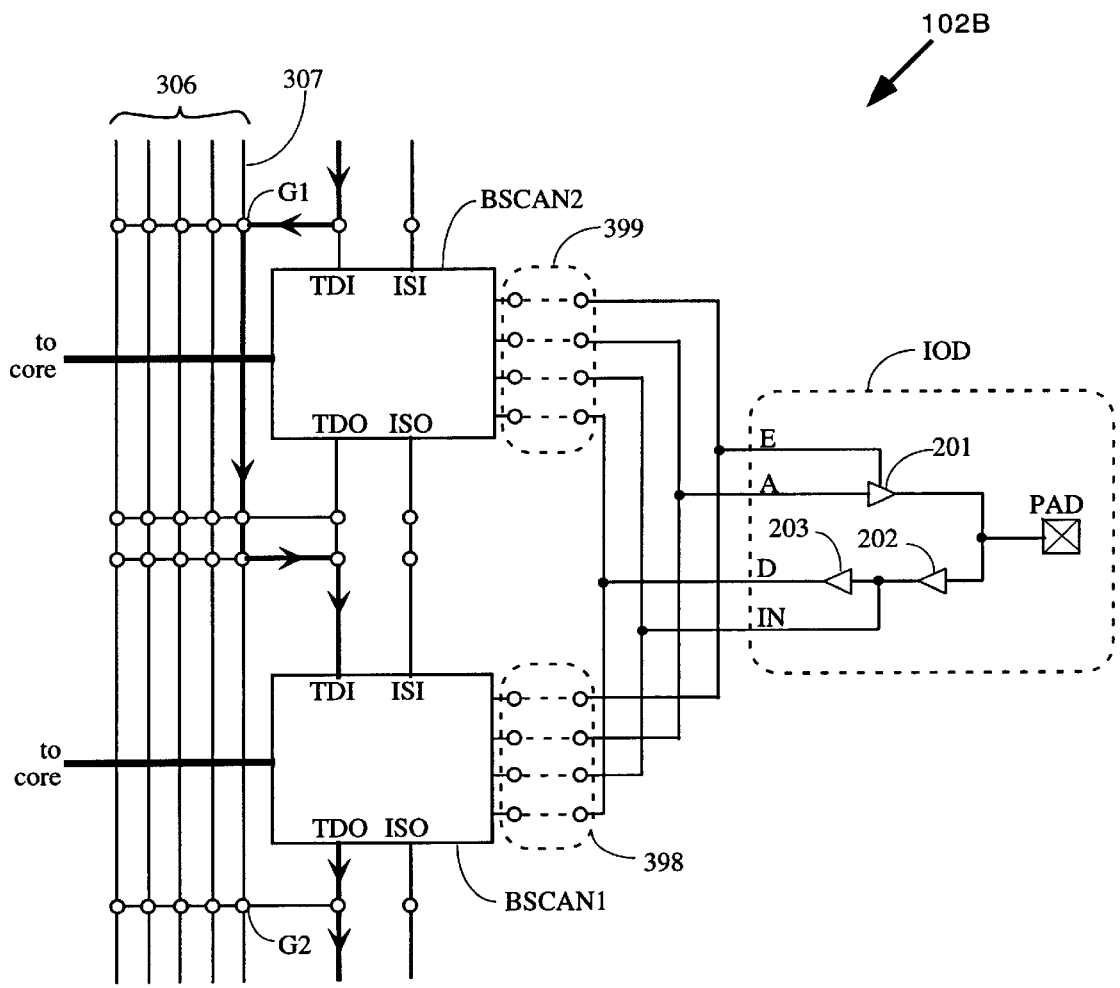
FIG. 3 shows an I/O cell having two boundary scan cells in accordance with the second aspect of the invention.

FIG. 3 shows an exemplary I/O cell 102B. In the embodiment of FIG. 3, two substantially similar boundary scan cells are provided. Each boundary scan cell BSCAN1, BSCAN2 interfaces with signals D, A, E, and IN through programmable connections (shown as dotted lines in FIG. 3) between connection points (shown as white circles in FIG. 3) in areas 398 and 399. Additionally, the two boundary scan cells BSCAN1, BSCAN2 can each be inserted into or left out of the data chain. Therefore, the data chain through the I/O cell of FIG. 3 can include no boundary scan cells (neither BSCAN1 nor BSCAN2), one boundary scan cell (either BSCAN1 or BSCAN2), or two boundary scan cells (both BSCAN1 and BSCAN2). For example, the arrowheads in FIG. 3 show a data chain wherein cell BSCAN1 is included and BSCAN2 is bypassed.

If both boundary scan cells were included in the data chain, the test data in (TDI) pin of cell BSCAN1 and the TDO pin of cell BSCAN2 could be connected through a simple vertical connection. Instead, the path around cell BSCAN2 uses MetaTrack line 307, one of five MetaTrack lines 306. When a connection is made at a connection point such as G1, the section of MetaTrack line above and below the connection point is dedicated to the signal. Therefore, in the example shown in FIG. 3, MetaTrack line 307 is in use from the top of the figure down to point G2, but can be connected to another signal at or below connection point G2. In one embodiment, the boundary scan data chain can programmably bypass any boundary scan cell by traversing the boundary scan cell with a line that is not connected to either TSI or TDO.

Signals ISI and ISO for each cell provide input and output connections (respectively) for a second chain through the boundary scan cells. This chain (which is described later in detail) is used for testing input register ILAT of FIG. 4. Without this chain, register ILAT would be untestable. In one embodiment, the ILAT testing chain can programmably bypass any boundary scan cell by traversing the boundary scan cell with a line that is not connected to either ISI or ISO. In another embodiment, one or more MetaTrack lines are provided for the ILAT testing chain.

In the preferred embodiment, each boundary scan cell BSCAN1, BSCAN2 has additional programmable connections with the core logic.

Exemplary Boundary Scan Cell

Figure 4:
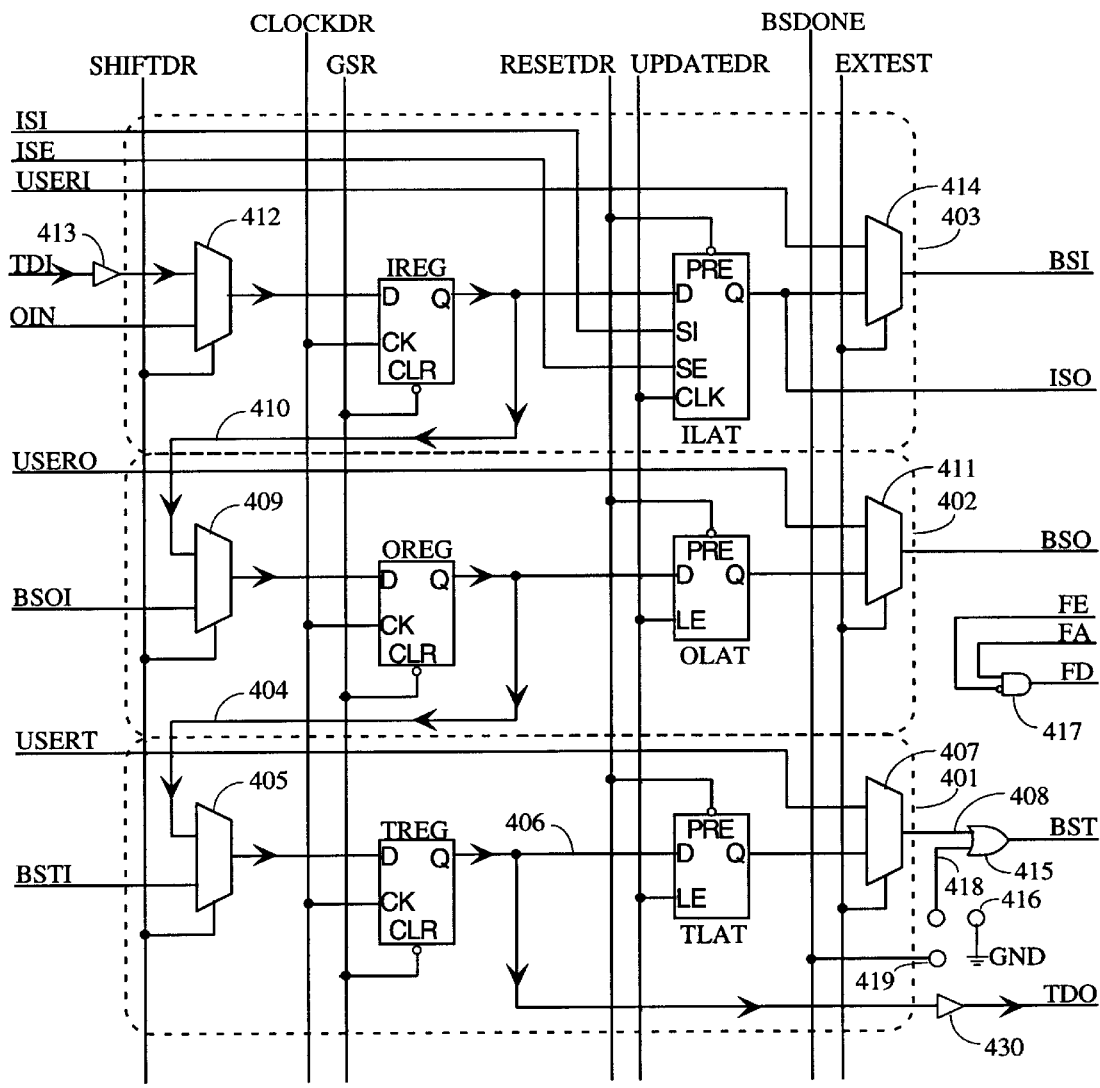
FIG. 4 shows a single boundary scan cell that can be used in the embodiment of FIG. 3.

FIG. 4 shows a single boundary scan cell that can be used in the embodiment of FIG. 3. This boundary scan cell is programmed by connecting terminals (cell inputs, cell outputs, and external signals) in various ways to produce the different cases discussed above. Since a boundary scan cell typically comprises three bits of the boundary scan data chain for an IC, the boundary scan cell of FIG. 4 can be viewed as three subcells, one per bit. The logic in subcell 401 relates to the output tristate enable bit; subcell 402 handles the output data bit; and subcell 403 includes the logic associated with the input bit. The path designated by arrowheads follows the boundary scan data chain from where it enters the cell at TDI, through subcells 403, 402, and 401, to where it leaves the cell at TDO. To support Case 8, where only the input bit is included in the boundary scan data chain, subcells 401 and 402 can be programmably omitted from the boundary scan cell.

In subcell 401, the boundary scan tristate input (BSTI) from the core and the previous bit 404 from the boundary scan data chain are multiplexed together in multiplexer 405 to drive the data input of tristate register TREG. (In the most common usage of boundary scan, signals BSTI and USERT are connected together in the core.) Multiplexer 405 is controlled by the SHIFTDR control signal from the boundary scan control logic, which in one embodiment is located in a corner of the IC (103 in FIG. 1). Such boundary scan control logic is well known in the art of programmable IC design. Tristate register TREG has clock (CK, CLOCKDR) and clear (CLR, GSR) signals, also from the boundary scan control logic. Output signal 406 of tristate register TREG drives the data input of tristate latch TLAT. Output signal 406 also drives buffer 430, which generates signal TDO. Tristate latch TLAT is controlled by the boundary scan control logic via a reset signal (PRE, RESETDR) and latch enable signal (LE, UPDATEDR). Multiplexer 407 selects between the output of tristate latch TLAT and user tristate signal USERT from the core, and drives signal line 408. Multiplexer 407 is controlled by global signal EXTEST from the boundary scan control logic.

Outside of subcell 401, line 408 drives OR-gate 415 along with line 418. Line 418 can be programmably tied to ground GND through programmable connection 416, or can be tied to global signal BSDONE through programmable connection 419. When emulating most FPGA IOBs, line 418 is tied to ground. When emulating any of the TDI, TCK, or TMS FPGA I/O pins, line 418 is tied to BSDONE, which is generated by the boundary scan control logic. (The TDI, TCK, or TMS pins are described on page 4–48 of the Xilinx 1996 Data Book, which page is incorporated herein by reference.) Tying line 418 to BSDONE forces the IOD connected to the boundary scan cell to be in input-only mode during boundary scan operation. When not in boundary scan operation, normal bidirectional I/O is supported. OR-gate 415 generates signal BST, which may be connected to the "E" or "FE" IOD pins, or may be left unconnected.

SHIFTDR, CLOCKDR, RESETDR, UPDATEDR, and EXTEST are well-known global signals commonly associated with corresponding boundary scan commands, as described in the IEEE Boundary Scan Standard. GSR is a global set/reset signal. BSDONE is a global control signal to force I/O pins to be inputs during boundary scan operation.

Subcell 402 includes the logic associated with the output bit. Subcell 402 is similar to subcell 401. Multiplexer 409 selects between boundary scan output signal BSOI from the core and the previous bit 410 in the boundary scan data chain. (In the most common usage of boundary scan, signals BSOI and USERO are connected together in the core.) The output of multiplexer 409 passes through register OREG and latch OLAT as in subcell 401. Multiplexer 411 selects between the output of latch OLAT and user output signal USERO from the core, and generates signal BSO. Signal BSO may be provided to the "A" or "FA" IOD pins, or may be left unconnected. Register OREG provides boundary scan data bit 404 to multiplexer 405 of subcell 401.

Subcell 403 includes the logic associated with the input bit. Subcell 403 is similar to subcell 401. Multiplexer 412 selects between boundary scan input signal OIN from the IOD and the previous bit TDI in the data chain. Input signal TDI drives multiplexer 412 through delay element 413. Delay element 413 inserts a delay to prevent setup and hold errors on the TDI input from the previous cell. The output of multiplexer 412 passes through register IREG and register ILAT as in subcell 401. Register ILAT has additional capabilities compared to latches OLAT and TLAT, in order to make it testable. (Latches OLAT and TLAT are testable from the pad, therefore they do not require these capabilities.) ILAT is a register rather than a latch. Input SI (ISI) provides the input for a full scan chain traversing the boundary scan cell from input ISI to output ISO. Input SE (ISE) from the boundary scan control logic switches the data source for register ILAT from register data input D (during normal boundary scan and operation of the device) to SI (during the scan test mode of the boundary scan control logic). In one embodiment, the data source selection is made by a multiplexer controlled by SE and selecting between register inputs D and SI. This structure provides a full scan test methodology not specified by the IEEE Boundary Scan Standard. The output of register ILAT drives signal ISO, which drives ISI of the next register ILAT in the testing chain. Multiplexer 414 selects between the output of register ILAT and user input signal USERI from the IOD, and generates signal BSI, which is an input via boundary scan to the core. Register IREG provides boundary scan data bit 410 to multiplexer 409 of subcell 402.

The boundary scan cell of FIG. 4 also includes AND-gate 417, the inputs (FA, inverted FE) and output (FD) of which can be programmably connected to other points. This AND-gate is used as a fake tristate driver to drive the OIN and USERI pins when emulating an unbonded IOB. In another embodiment, two gates are provided, one gate emulating an IOB with a resistive pullup (FA ORed with FE), and one gate emulating an IOB with a resistive pulldown (FA ANDed with inverted FE, as shown in FIG. 4). To emulate an IOB with no pullup or pulldown, either gate can be used since the state of the pin is indeterminate. In one embodiment, additional cases are added to support the resistive pullup/pulldown/no resistor options.

Programmable Connections for the Nine Cases

To produce the nine different cases supported by the embodiment of FIG. 4, programmable connections are made as shown in the following table. When a signal name appears in the "Core Connections" column, it means that the signal is connected to the core. When two signal names appear in the "Core Connections" column on the same line, the signals are connected to each other as well as to the core. When two or more signal names appear in the "IOD Connections" column on the same line, the signals are connected to each other. If a signal name appears in the "Traversals" column, the signal traverses the boundary scan cell between the core and the IOD.

| CASE | CORE CONNECTIONS | IOD CONNECTIONS | TRAVERSALS |
|---|---|---|---|
| 1 | none | none | none |
| 2 | BSI | USERI, OIN, IN | none |
|   | USERO, BSOI | BSO, A |   |
|   | USERT, BSTI | BST, E |   |
| 3 | BSI | USERI, OIN, JN | D |
|   | USERO, BSOI | BSO, A |   |
|   | USERT, BSTI | BST, E |   |
| 4 | BSI | USERI, OIN, FD | none |
|   | USERO, BSOI | BSO, FA |   |
|   | USERT, BSTI | BST, FE |   |
| 5 | BSI | USERI, OIN, FD | D |
|   | USERO, BSOI | BSO, FA |   |
|   | USERT, BSTI | BST, FE |   |
| 6 | BSI | USERI, OIN, FD |   |
|   | USERO, BSOI | BSO, FA | A |
|   | USERT, BSTI | BST, FE | E |
| 7 | BSI | USERI, OIN, FD | D |
|   | USERO, BSOI | BSO, FA | A |
|   | USERT, BSTI | BST, FE | E |
| 8 | BSI | USERI, OIN, IN | D |
| 9 | BSI | USERI, OIN, IN |   |
|   | USERO, BSOI |   | A |
|   | USERT, BSTI |   | E |

Exemplary Mask Programmed I/O Cell

Figure 5:
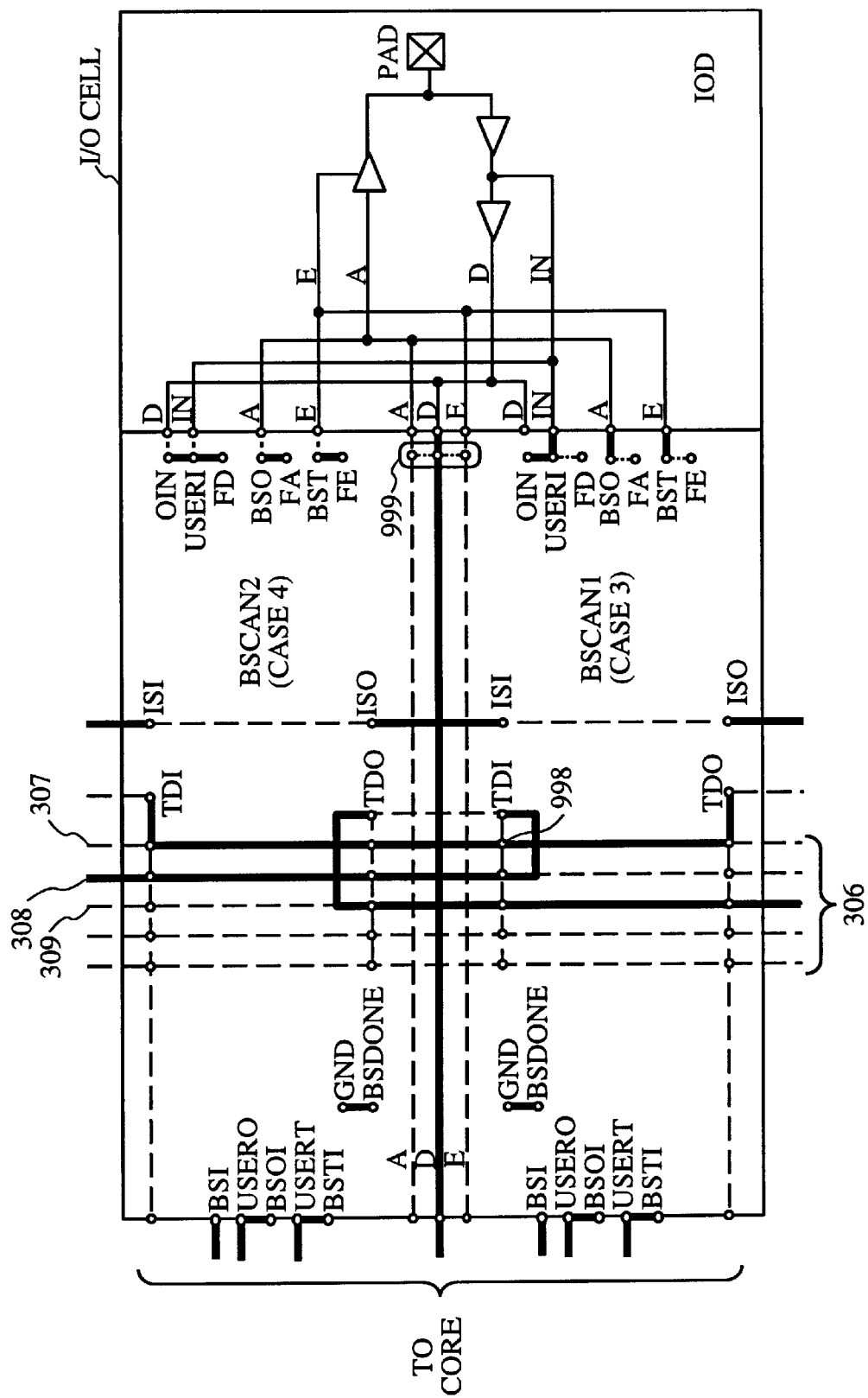
FIG. 5 shows a mask programmed HardWire I/O cell with two boundary scan cells.

FIG. 5 shows an exemplary mask programmed I/O cell with two boundary scan cells, demonstrating the above table using the combination of Cases 3 and 4. BSCAN1 is mask programmed as in Case 3, where the boundary scan logic is used and is connected to the IOD, and an additional direct path is provided from the "D" terminal of the IOD to the core. BSCAN2 is mask programmed as in Case 4, where the boundary scan logic is used, but is not connected to the IOD. Therefore, this I/O cell emulates two adjacent IOBs in the emulated FPGA, where one IOB is bonded and the other is not. In FIG. 5, white circles show mask programmable connection points. Mask programmable connections that have been implemented are shown as heavy lines. Available tracks for mask programmable connections that are not used in this I/O cell are shown as dotted lines.

Only one set of A, E, D direct connections to the core is available, and only the D connection is used in the example shown in FIG. 5. Since only one of the two boundary scan cells can be connected to the IOD in a given I/O cell, the same set of direct connections can be used by both boundary scan cells. The A or E direct connections can also be used to route the D signal if necessary to improve the routing, using the connection points in area 999. FIG. 5 also shows the mask programmable connection of the BSDONE signal to ground.

In the example of FIG. 5, the boundary scan data chain traverses the boundary scan cells in reverse order, to demonstrate the use of the MetaTrack feature. The data chain enters the I/O cell at the top edge on MetaTrack line 308, then travels down and connects to the TDI pin of cell BSCAN1. (Although FIG. 5 shows the connection from MetaTrack 308 to BSCAN1 TDI making a U-shaped turn to avoid connection point 998, the connection line can actually pass directly over or under point 998, which results in a smaller implementation for the MetaTrack lines.) From the TDO pin of cell BSCAN1, the data chain uses MetaTrack line 307 to connect upward to the TDI pin of cell BSCAN2. From the TDO pin of cell BSCAN2, the data chain uses MetaTrack line 309 and exits at the bottom edge of the I/O cell.

Detailed Description of a Third Embodiment

Another embodiment uses a different set of cases. This embodiment has the advantage of having fewer possible cases; therefore, the conversion software is simplified. This simplification is achieved by viewing the two boundary scan cells of FIG. 3 as a single programmable entity, a "double" boundary scan cell. Therefore, an I/O cell for this embodiment comprises one IOD and one double boundary scan cell. In another embodiment, the I/O cell comprises one IOD and more than two boundary scan cells.

The advantage of the embodiment containing a single IOD and a grouped set of boundary scan cells is the reduction in the number of programmable cases. This embodiment requires only four general cases and two special cases, for a total of six cases. (This number can also be further reduced as later described.) The premise behind the smaller number of cases is that each I/O cell can have only one boundary scan cell tied to the IOD. The term "REAL" is used herein to describe a boundary scan cell which is used and is connected to the IOD. The term "FAKE" is used to describe a boundary scan cell that is not connected to the IOD. The term "MODE3" refers to a special kind of REAL boundary scan cell that does not drive the output side of the I/O pin, but is still connected to the input logic of the IOD. The term "MODE1" refers to a special kind of REAL boundary scan cell that only contains the input cell (e.g., 403 in FIG. 4) of the boundary scan cell, and is connected to the IOD input logic. The table below describes the cases for this embodiment, and is based upon FIG. 3.

In the following table, "BSCAN1" and "BSCAN2" refer to the boundary scan cells in FIG. 3. The column heading "Traversals" refers to signals connected from the IOD across the boundary scan cells to the core. The difference between General Cases 3 and 4 is described in the text following the table. For this embodiment, the six cases are:

| CASE | BSCAN1 | BSCAN2 | TRAVERSALS |
| --- | --- | --- | --- |
| General Case 1: | REAL | FAKE | D |
| General Case 2: | FAKE | REAL | D |
| General Case 3: | FAKE | FAKE | A, E, D |
| General Case 4: | FAKE | FAKE | A, E, D |
| Special Case 1: | MODE1 | FAKE | D |
| Special Case 2: | MODE3 | FAKE | A, E, D |

In General Case 1, the BSCAN1 cell is connected to the IOD, (i.e., REAL), the BSCAN2 cell is available as another boundary scan cell (i.e., FAKE), and signal D traverses the BSCAN cells from the IOD to the core logic. Note that the FAKE cell need not actually be utilized. In other words, the FAKE cell (BSCAN2) need not have its TDI and ISI signals connected to another TDO and ISO (respectively). In order to accommodate this functionality, the BSCAN2 TDI pin shown in FIG. 3 is tied to a line with a known voltage level. In one embodiment, the TDI pin is tied to ground. In one embodiment, this is accomplished by allowing the TDI, TDO, ISI, and ISO pins access to the core. Using the pins in this way has no impact on the usage of the MetaTrack lines for that cell. In another embodiment, programmable ground connections are provided in the boundary scan cell for the TDI and ISI pins. Therefore, General Case 1 can be used to emulate one boundary scan cell used and connected to the IOD (BSCAN1), or to emulate two boundary scan cells, one boundary scan cell being used and connected to the IOD (BSCAN1), and one boundary scan cell used but not connected to the IOD (BSCAN2). General Case 1 is similar to the previously described embodiment if a Case 3 cell is placed in BSCAN1 and a Case 4 cell is placed in BSCAN2.

General Case 2 is similar to General Case 1. The difference is in which boundary scan cell is used for connection to the IOD. In General Case 2, the BSCAN2 boundary scan cell is connected to the IOD (REAL), and the BSCAN1 boundary scan cell is utilized as a FAKE. Note that this is merely a swapping of the positions of BSCAN1 and BSCAN2. This capability is advantageous because it can reduce the routing requirements of the core logic. Note that General Case 2 is not required for this embodiment to be complete; however, it is included to illustrate the advantage of having symmetrical boundary scan cells.

General Case 3 has FAKE boundary scan cells in both of the BSCAN1 and BSCAN2 cells, and makes the IOD's A, E, and D signals available to the core. Like the FAKE boundary scan cell in General Cases 1 and 2, each of the FAKE boundary scan cells in General Case 3 can be utilized, or not utilized, as determined by the connections for the TDI and other core port pins. This means that General Case 3 allows zero, one, or multiple boundary scan cells to be used for boundary scan, with the IOD's A, E, and D pins directly available to the core, and not connected to either BSCAN1 or BSCAN2. Thus, General Case 3 is used to emulate boundary scan where the I/O pin is driven from the core. The boundary scan cells can be used to emulate unbonded IOBs.

General Case 4 is similar to General Case 3 except that the IOD is not connected. This case is used when the IOD is utilized as a power supply pin (either VDD or ground) for the emulated FPGA. However, in cases where the HardWire device has a large number of unbonded IOBs, this case can be used to support zero, one, or multiple boundary scan cells. Note that General Case 4 is not required for this embodiment to be complete, because the functionality can be achieved by using General Case 3 if the IOD is programmed as a power pin. The IOD used for power for General Case 3 is not the same as the IOD used for power for General Case 4. The General Case 4 IOD used as a power pin has more area available for power distribution, since it does not contain the A, E, and D signal traverses of the boundary scan cells.

Special Case 1 is used to emulate the M0 and M2 pins in Xilinx XC4000 Series FPGAs. Special Case 1 contains a special "REAL" cell in the BSCAN1 position, a FAKE cell in the BSCAN2 position, and the IOD's D signal is available to the core. The special REAL cell of Special Case 1 contains a single bit for the boundary scan chain, and is substantially the same as subcell 403 of FIG. 4. However, the TDO signal for the special REAL cell comes from signal line 410.

Note that Special Case 1 is not required for this embodiment, as the function can be achieved in the core with very little impact. To implement this function in the core, General Case 3 can be used to provide the needed D signal to the core from the IOD. As with all of the FAKE cells, BSCAN1 and BSCAN2 may be used or not used, according to the needs of the conversion.

Special Case 2 is similar to Special Case 1 except that the REAL boundary scan cell is connected differently to the IOD, and the IOD has the A, E, and D signals connected to the core. Unlike Special Case 1, in Special Case 2 the REAL cell includes all of the logic of FIG. 4. However, in Special Case 2 multiplexers 411 and 407 do not drive the A and E signals (through BSO and BST, respectively) of the IOD. In this way, the M1 pin in Xilinx XC4000 Series FPGAs is correctly emulated. Note that Special Case 3 is not required for this embodiment, as the same functionality may be obtained by using a General Case 3 cell and making the connections in the core instead of in the boundary scan cells.

This embodiment provides a mixture of boundary scan cell types to accommodate the special requirements of converting a Xilinx FPGA to a HardWire device. In one embodiment, only two cases are required, General Case 1 and General Case 3. In another embodiment, General Case 2, General Case 4, Special Case 1, and Special Case 2 cases are also included. These additional cases are advantageous because they simplify the routing between the core cells and the I/O cells.

SUMMARY

It has been demonstrated that the mask programmable IC of the present invention offers the advantages of providing a low-cost replacement for an FPGA while retaining the I/O characteristics, special features, configuration behavior, and boundary scan capability of the emulated FPGA. Further, in some embodiments the invention allows a single programmable IC to emulate any of two or more FPGAs which may be in any of several different packages. Prior art mask programmable ICs either failed to provide I/O characteristics and features similar to that of the FPGA, or were suitable for only a single FPGA. Thus it will be understood that the present invention provides a novel mask programmable IC.

The above text describes the programmable IC of the invention in the context of mask programmable ICs used to replace FPGAs and/or PLDs in existing boards or systems. However, the invention can also be applied to programmable ICs used for other purposes, such as to provide programmable I/O behavior in newly designed systems.

Those having skill in the relevant arts of the invention will now perceive various modifications and additions which may be made as a result of the disclosure herein of preferred embodiments. For example, although the invention was described herein as applied to particular Xilinx FPGAs, the invention can be applied to other FPGA architectures and to FPGAs from other manufacturers. Additionally, the invention can be applied to programmable devices other than FPGAs, such as PLDs. Accordingly, all such modifications and additions are deemed to be within the scope of the invention, which is to be limited only by the appended claims and their equivalents.

What is claimed is:

1. A mask programmable IC having boundary scan capability, said IC comprising:
   a plurality of I/O pads;
   a plurality of boundary scan cells, each cell being capable of implementing the boundary scan functions associated with one of said plurality of pads, each cell having a TDI input and a TDO output; and
   a plurality of dedicated tracks for adding mask programmable interconnect lines,
   said tracks providing paths whereby said TDO output of a first cell and said TDI input of a second cell can be interconnected, said tracks further providing paths whereby said TDO output of said second cell and said TDI input of a third cell can be interconnected, said first, second, and third cells being physically located in any order on the mask programmable IC.

2. The mask programmable IC of claim 1 wherein said dedicated tracks are physically located within said boundary scan cells.

3. The mask programmable IC of claim 1 wherein said IC further comprises a programmable core, and said dedicated tracks are physically located between said boundary scan cells and said core.

4. The mask programmable IC of claim 1 wherein said IC further comprises a programmable core, and said dedicated tracks are physically located within said core.

5. The mask programmable IC of claim 1 wherein said plurality of dedicated tracks numbers at least five.

6. The mask programmable IC of claim 1 further comprising a programmable connection other than said tracks, said programmable connection being between said TDO output of each cell and said TDI input of one adjacent cell.

7. A programmable IC having boundary scan capability, said IC comprising:
   a plurality of I/O pads;
   a plurality of boundary scan cells, each cell being capable of implementing the boundary scan functions associated with one of said plurality of pads, each cell having a TDI input and a TDO output; and
   a plurality of dedicated programmable interconnect lines,
   said lines programmably connecting said TDO output of a first cell and said TDI input of a second cell, said lines further programmably connecting said TDO output of said second cell and said TDI input of a third cell, said first, second, and third cells being physically located in any order on the mask programmable IC.

8. The programmable IC of claim 7 wherein said dedicated lines are physically located within said boundary scan cells.

9. The programmable IC of claim 7 wherein said IC further comprises a programmable core, and said dedicated lines are physically located between said boundary scan cells and said core.

10. The programmable IC of claim 7 wherein said IC further comprises a programmable core, and said dedicated lines are physically located within said core.

11. The programmable IC of claim 7 wherein said plurality of dedicated lines numbers at least five.

12. The programmable IC of claim 7 further comprising a programmable connection other than said lines, said programmable connection being between said TDO output of each cell and said TDI input of one adjacent cell.

13. A programmable I/O cell comprising:
   a first boundary scan cell capable of implementing the boundary scan functions associated with one I/O pad, the first boundary scan cell having a data input and a data output;
   means for programmably connecting the data input of the first boundary scan cell to the data output of a second boundary scan cell; and
   means for programmably connecting the data output of the first boundary scan cell to the data input of a third boundary scan cell,
   thereby forming a boundary scan data chain wherein the first, second, and third boundary scan cells are physically located in any order on the mask programmable IC.

14. The programmable I/O cell of claim 13, further comprising an I/O pad.

15. A mask programmable IC having boundary scan capability, said IC comprising:
   a plurality of I/O pads;
   a plurality of boundary scan cells, each cell being capable of implementing the boundary scan functions associated with one of said plurality of pads, each cell being associated with a single one of said plurality of I/O pads, each cell having a TDI input and a TDO output; and
   a plurality of dedicated tracks for adding mask programmable interconnect lines,
   said tracks providing paths whereby said TDO output of a first cell and said TDI input of a second cell can be interconnected, and said TDO output of said second cell and said TDI input of a third cell can be interconnected,
   wherein the first, second, and third cells are physically located in any order on the mask programmable IC.

16. The mask programmable IC of claim 15 wherein said dedicated tracks are physically located within said boundary scan cells.

17. The mask programmable IC of claim 15 wherein said IC further comprises a programmable core, and said dedicated tracks are physically located between said boundary scan cells and said core.

18. The mask programmable IC of claim 15 wherein said IC further comprises a programmable core, and said dedicated tracks are physically located within said core.

19. The mask programmable IC of claim 15 wherein said plurality of dedicated tracks numbers at least five.

20. The mask programmable IC of claim 15 further comprising a programmable connection other than said tracks, said programmable connection being between said TDO output of each cell and said TDI input of one adjacent cell.

21. A programmable IC having boundary scan capability, said IC comprising:
   a plurality of I/O pads;
   a plurality of boundary scan cells, each cell being capable of implementing the boundary scan functions associated with one of said plurality of pads, each cell being associated with a single one of said plurality of I/O pads, each cell having a TDI input and a TDO output; and
   a plurality of dedicated programmable interconnect lines,
   said lines programmably connecting said TDO output of a first cell and said TDI input of a second cell, and further programmably connecting said TDO output of said second cell and said TDI input of a third cell,
   wherein the first, second, and third cells are physically located in any order on the mask programmable IC.

22. The programmable IC of claim 21 wherein said dedicated lines are physically located within said boundary scan cells.

23. The programmable IC of claim 21 wherein said IC further comprises a programmable core, and said dedicated lines are physically located between said boundary scan cells and said core.

24. The programmable IC of claim 21 wherein said IC further comprises a programmable core, and said dedicated lines are physically located within said core.

25. The programmable IC of claim 21 wherein said plurality of dedicated lines numbers at least five.

26. The programmable IC of claim 21 further comprising a programmable connection other than said lines, said programmable connection being between said TDO output of each cell and said TDI input of one adjacent cell.

27. A programmable I/O cell comprising:
   an I/O pad;
   a boundary scan cell capable of implementing the boundary scan functions associated with said I/O pad, the boundary scan cell having a data input and a data output;
   means for programmably connecting the data output of the boundary scan cell to the data input of a first other scan cell; and
   means for proarammably connecting the data input of the boundary scan cell to the data output of a second other scan cell, thereby forming a boundary scan data chain wherein the first and second other scan cells are each physically located in either direction from the programmable I/O cell.

28. The programmable I/O cell of claim 27, further comprising means for programmably connecting the data output of each boundary scan cell to the data input of an adjacent boundary scan cell.

* * * * *